United States Patent [19]

Toyama et al.

[11] Patent Number: 5,326,674
[45] Date of Patent: Jul. 5, 1994

[54] METHOD FOR PROCESSING PHOTOSENSITIVE COPYING MATERIALS

[75] Inventors: Tadao Toyama; Atsushi Sakamoto, both of Shizuoka, Japan

[73] Assignee: Fuji Photo Film Co., Ltd., Minami-Ashigara, Japan

[21] Appl. No.: 875,028

[22] Filed: Apr. 28, 1992

[30] Foreign Application Priority Data

Apr. 30, 1991 [JP] Japan .................. 3-099286
Apr. 30, 1991 [JP] Japan .................. 3-099287

[51] Int. Cl.$^5$ .................................. G03C 5/00
[52] U.S. Cl. ........................... 430/325; 430/326; 430/330; 430/146; 430/281; 430/282; 430/283; 430/287; 430/294
[58] Field of Search ............... 430/325, 326, 330, 146, 430/281, 282, 283, 287, 294

[56] References Cited

U.S. PATENT DOCUMENTS 3,136,637 6/1964 Larson .
4,207,106 6/1980 Odawara et al. .
4,210,711 7/1980 Kitajima et al. ............... 430/325
4,528,262 7/1985 Nakano et al. .
4,822,719 4/1989 Schneller ....................... 430/326

FOREIGN PATENT DOCUMENTS 0175244 1/1986 European Pat. Off. .
2523719 12/1975 Fed. Rep. of Germany .
WP90/02975 3/1990 PCT Int'l Appl. .

*Primary Examiner*—John Kight, III
*Assistant Examiner*—Duo Truong
*Attorney, Agent, or Firm*—Burns, Doane, Swecker & Mathis

[57] ABSTRACT

A method for processing a photosensitive copying material comprises the steps of imagewise exposing to light a photosensitive copying material which comprises in order (i) a first photosensitive organic coating layer whose solubility in a developer varies through irradiation with light rays and (ii) a second organic coating layer containing a water-insoluble and organic solvent-soluble polymeric compound having an film-forming ability and then developing the imagewise exposed copying material, wherein the imagewise exposed material is dipped in the developer and then water-washed to remove the first and second organic coating layers on non-image portions. According to this method, the ability of the developer to process photosensitive copying materials is substantially improved, the amount of the waste liquor can substantially be reduced and a problem of environmental pollution can effectively be solved.

20 Claims, No Drawings

METHOD FOR PROCESSING PHOTOSENSITIVE COPYING MATERIALS

BACKGROUND OF THE INVENTION

The present invention relates to a method for processing photosensitive copying materials and in particular to a method for processing photosensitive copying materials which can reduce the amount of a developer used and is favorable for environmental protection.

There have been known, for instance, presensitized plates for use in making lithographic printing plates (hereinafter referred to as "PS plates"), photosensitive resist materials and photosensitive proofing materials as photosensitive copying materials which comprise photosensitive components such as o-quinonediazide compounds, diazonium salts, photopolymerizable photosensitive materials or photocrosslinkable photosensitive materials.

In particular, a positive-working PS plate which has been widely used comprises an aluminum plate serving as a support provided thereon with a photosensitive layer comprising an o-quinonediazide compound. It has been known that the o-quinonediazide compound is converted into a carboxylic acid through the irradiation with ultraviolet rays and accordingly if an exposed PS plate is developed with an aqueous alkaline solution, only the area on the photosensitive layer exposed to light is removed to expose the support surface. Since the surface of the aluminum support is hydrophilic, the surface (non-image area) of the support exposed through the development retains water and repels a printing ink. On the other hand, the area (image area) from which the photosensitive layer is not removed through the development is lipophilic. Therefore, the image area repels water and receives a printing ink.

There have been known various kinds of aqueous alkaline solutions used as developers for such positive-working PS plates and most preferred are aqueous solutions of silicates such as sodium silicate and potassium silicate. This is because the developing ability thereof can be controlled to some extent by adjusting the ratio of silicon oxide to alkali metal oxide (in general expressed in terms of a molar ratio $[SiO_2]/[M_2O]$), which are components of the silicate, and the concentration of the silicate.

Besides the foregoing positive-working PS plates, these silicates have preferably been used as components of the developers for reversal negative-working PS plates which are provided with o-quinonediazide photosensitive layers as disclosed in Japanese Patent Publication for Opposition Purpose (hereinafter referred to as "J.P. KOKOKU") No. Sho 56-14970 and negative-working PS plates which are provided with photosensitive layers comprising resins carrying dimethylmaleimido groups on the side chains as photocrosslinking agents.

As has been discussed above, the usual development of these photosensitive copying materials comprises dissolving the area on the photosensitive layer corresponding to non-image portions with a developer to thus reveal the support surface. For this reason, the concentration of the photosensitive components dissolved in the developer gradually increases as the development proceeds and this results in the formation of dregs and sludge and a reduction of the processing ability (ability of dissolution) of the developer.

Moreover, automatic developing machines for PS plates have widely been employed in the field of the plate-making and printing to rationalize and standardize the plate-making operations. The automatic developing machine in general comprises a device for conveying a PS plate to be processed, a bath for accommodating a developer and a device for spraying the developer and developing the PS plate by pumping up the developer and spraying it on the exposed PS plate through a spray nozzle while horizontally conveying the exposed PS plate. Alternatively, there has also been known a method which comprises conveying an exposed PS plate while immersing the plate in a developer contained in a developing bath by the action of submerged guide rolls.

When positive-working PS plates are processed using such an automatic developing machine and a large amount of the PS plates are processed, the method suffers from problems of formation of insoluble dregs and sludge and clogging of a spray pipe and a nozzle.

There have been proposed techniques for eliminating these drawbacks, for instance, methods for maintaining the processing ability of a developer and hence preventing the formation of dregs and sludge through supplementation of a replenisher (see, for instance, Japanese Unexamined Patent Publication (hereinafter referred to as "J.P. KOKAI") No. Sho 54-62004(=U.S. Pat. No. 4,259,434) and J.P. KOKOKU No. Sho 57-7427(=U.S. Pat. No, 4,259, 434). These methods make it possible to eliminate the formation of such insolubles, but are accompanied by an increase in waste liquor. This problem can be solved by the method disclosed in J.P. KOKAI No. Hei 2-3065(=EP 347245A), but it has still been requested to reduce the running cost and the amount of the waste liquor. In particular, the reduction in the industrial waste has attracted special interest recently on a worldwide scale.

On the other hand, representative negative-working photosensitive copying materials include PS plates provided with photosensitive layers comprising diazonium salts. In addition, there have recently been known, for instance, negative-working PS plates having photosensitive layers which comprise polymerizable monomers and photopolymerization initiators and those having photocrosslinkable photosensitive layers which comprise, for instance, cinnamic acid and dimethylmaleimides.

In the development of these negative-working PS plates, there is a limit in the processing ability of the developer like the foregoing positive-working PS plate and a large amount of replenisher must be employed. Moreover, the processing of a large number of PS plates is accompanied by deposition of dregs and sludge due to the components of the photosensitive layers and accordingly it is difficult to perform stable processing over a long time.

Besides, J.P. KOKOKU Nos. Sho 54-21089(=U.S. Pat. No. 4,207,106) and Sho 37-11558(=U.S. Pat. No. 3,136,637) disclose multi-layer photosensitive copying materials comprising organic coating layers hardly soluble in developers applied onto photosensitive layer comprising o-quinonediazide compounds or photosensitive diazo resins. These photosensitive copying materials are preferred for the reasons that they contain only a small amount of the components soluble in the developers and accordingly the developer is deteriorated by the processing only to a small extent. However, these photosensitive layers and polymeric compounds useful as the organic coating layers have many common solvents and thus the polymeric compounds usable as the organic coating materials are limited to those soluble in poor solvents for the components of the photosensitive layers. Furthermore, the dregs of the organic coating layer which are scraped out in the developer and get swollen is again deposited on the processed PS plates and those during processing and are precipitated in the developer. This makes stable processing over a long time impossible.

SUMMARY OF THE INVENTION

Accordingly, an object Of the present invention is to provide an improved method for processing photosensitive copying materials which permits the reduction of industrial waste.

Another object of the present invention is to provide an improved method for processing photosensitive copying materials which does not form any insolubles even if a large quantity of photosensitive copying materials are processed over a long time and which ensures stable processing thereof.

The inventors of this invention have conducted various studies to accomplish the foregoing objects, have discovered a method capable of making the dissolution of the photosensitive layer in a developer minimum and thus have completed the present invention.

According to an aspect of the present invention, there is provided a method for processing a photosensitive copying material which comprises the steps of imagewise exposing a photosensitive copying material comprising a support provided thereon with in order (i) a first photosensitive organic coating layer whose solubility in a developer varies through irradiation with light rays and (ii) a second organic coating layer containing a water-insoluble and organic solvent-soluble polymeric compound having a film-forming ability and then developing the imagewise exposed material, wherein the imagewise exposed material is dipped in the developer and then water-washed to remove the first and second organic coating layers on non-image portions.

According to another aspect of the present invention, there is provided a method for processing a photosensitive copying material which comprises the steps of imagewise exposing a photosensitive copying material comprising a support provided thereon with in order (i) a first photosensitive organic coating layer whose solubility in a developer varies through irradiation with light rays and (ii) a second organic coating layer formed by applying an emulsion (a polymer latex) of a water-insoluble and organic solvent-soluble polymeric compound having a film-forming ability and then developing the imagewise exposed material, wherein after the imagewise exposure of the photosensitive copying material, the imagewise exposed material is dipped in the developer and then water-washed to remove the first and second organic coating layers on non-image portions.

According to a third aspect of the present invention, there is provided a method for processing a photosensitive copying material which comprises the steps of imagewise exposing a photosensitive copying material comprising a support provided thereon with in order (i) a first organic coating layer which is a negative-working photosensitive layer whose solubility in a developer is lowered through irradiation with light rays and (ii) a second organic coating layer formed by applying an emulsion (a polymer latex) of a water-insoluble polymeric compound having a film-forming ability and then developing the imagewise exposed material, wherein after the imagewise exposure of the photosensitive copying material, the imagewise exposed material is dipped in the developer and then water-washed to remove the first and second organic coating layers on non-image portions.

In this respect, the photosensitive copying material comprising (i) the first organic coating layer which is a negative-working photosensitive layer and (ii) the second organic coating layer means those generally comprising at least two organic coating layers on a support, one of which comprises a diazonium salt and changes the solubility in a developer through the irradiation with actinic rays as disclosed in J.P. KOKOKU No. Sho 62-61136. In the present invention, the photosensitive layer comprising diazonium salts may be replaced with photohardenable ones such as those comprising photopolymerizable and photocrosslinkable compounds.

DESCRIPTION OF THE PREFERRED EMBODIMENTS

The present invention will be detailed below.

Supports

The supports used for the production of photosensitive copying material processed in the present invention are dimensionally stable plate-like materials and include, for example, paper, paper laminated with a plastic film (such as polyethylene, polypropylene or polystyrene film), metal plates such as aluminum (including alloys thereof), zinc, iron and copper plates, plastic films such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal films, paper and plastics laminated with foils of the foregoing metals or on which such a metal is vapor-deposited, and glass plates. Among them, the aluminum plate is particularly preferred, if the photosensitive coating material is a PS plate.

Aluminum supports are in general used in the PS plate as an example of the photosensitive copying material processed by the present invention. Preferred aluminum plates are, for instance, those of pure aluminum or an aluminum alloy comprising aluminum and a trace amount of other elements as well as plastic films laminated with an aluminum film or on which aluminum is vapor-deposited. Examples of the trace elements are silicon, iron, manganese, copper, magnesium, chromium, zinc, bismuth, nickel and/or titanium. The amount of the elements other than aluminum is at most 10% by weight. The aluminum substrate preferably used in the invention is a pure aluminum plate, but it is presently difficult to obtain a completely pure aluminum plate from the viewpoint of refining technique. Therefore, an aluminum plate containing other elements as low as possible is employed. The aluminum plate containing other elements in the order of the foregoing range can be used in the invention without any problem. In other words, the aluminum plates usable in the invention are not restricted to those having specific compositions and may be those commonly known and used in this art. The aluminum plate used in the invention has a thickness in the order of about 0.1 to 0.6 mm.

Such an aluminum plate is surface-roughened for improving the water retention of the surface and adhesion to a photosensitive layer subsequently applied thereto, but it is optionally treated, prior to the surface graining treatment, with an aqueous solution containing a surfactant or an aqueous alkaline solution to remove the rolling oil from the surface thereof.

The lithographic printing plate prepared by the method according to the present invention may be a single-sided or double-sided one. The single-sided and double-sided printing plates may be prepared by the same treatment and, therefore, the present invention will hereinafter be described while taking the single-sided one by way of example.

First, an aluminum plate as a support for a PS plate is surface-roughened. Such surface-roughening treatments are, for instance, mechanical surface-roughening treatments, methods for electrochemically dissolving the surface and methods for chemically selectively dissolving the surface. The mechanical surface-roughening treatments can be carried out by any known methods such as ball graining, brush graining, blast graining and buff graining methods. In addition, the electrochemical surface-roughening treatment is, for instance, performed by passing an alternating or direct current through the aluminum plate in an electrolyte such as hydrochloric acid or nitric acid. Moreover, it is also possible to use combinations of these two kinds of methods as disclosed in J.P. KOKAI No. Sho 54-63902.

The aluminum plate thus surface-roughened may optionally be subjected to alkali etching and neutralization treatments and thereafter, anodized for improving the water retention and wear resistance Of the surface. Any electrolyte can be used in the anodization treatment of an aluminum plate so far as they can form a porous anodized layer and generally include, for instance, sulfuric acid, phosphoric acid, oxalic acid, chromic acid or mixture thereof. The concentration of these electrolytes are appropriately determined depending on the kinds of the electrolytes selected.

The conditions for the anodization vary depending on the kinds of the electrolytes selected, but in general the anodization is preferably performed at an electrolyte concentration ranging from 1 to 80% by weight, an electrolyte temperature ranging from 5° to 70° C., a current density ranging from 5 to 60 A/dm$^2$ and a voltage ranging from 1 to 100 V for 10 seconds to 5 minutes.

The amount of the anodized layer is preferably not less than 1.0 g/m$^2$ and more preferably 2.0 to 6.0 g/m$^2$. This is because if it is less than 1.0 g/m$^2$, the resulting lithographic printing plate has insufficient printing durability and the non-image portion thereof is easily damaged, which leads to the occurrence of so-called "contamination due to defects", i.e., the adhesion of ink to defects during printing operation.

After the foregoing treatments, the aluminum plate is then hydrophilized, if desired. The hydrophilization thereof can be carried out by any conventionally known method. An example of the hydrophilization treatment used in the present invention is an alkali metal silicate (such as an aqueous sodium silicate solution) treatment as disclosed in U.S. Pat. Nos. 2,714,066, 3,181,461, 3,280,734 and 3,902,734. In the method, a substrate is treated by immersing or electrolyzing in an aqueous solution of sodium silicate. Examples of other hydrophilization treatments are treatments with potassium fluorozirconate as disclosed in J.P. KOKOKU No. Sho 36-22063 and a treatment with polyvinyl phosphonic acid as disclosed in U.S. Pat. Nos. 3,276,868, 4,153,461 and 4,689,272.

Organic Underlying Layer

An organic underlying layer is also applied, if desired, onto the aluminum plate prior to the application of a photosensitive layer. Organic compounds used in the organic underlying layer are, for instance, carboxymethyl cellulose, dextrin, gum arabic, amino acids such as glycine and β-alanine, organophosphonic acids such as phenylphosphonic acid, hydrochlorides of amines having hydroxyl groups such as triethanolamine hydrochloride, and mixtures thereof.

In the present invention, the organic layer can be formed by a method comprising the steps of applying a solution of the foregoing organic compound dissolved in water, an Organic solvent such as methanol, ethanol, methyl ethyl ketone or a mixture thereof to the hydrophilized aluminum plate and then drying or a method comprising the steps of dipping the hydrophilized aluminum plate in a solution of the foregoing compound dissolved in water, an organic solvent such as methanol, ethanol, methyl ethyl ketone or a mixture thereof to adsorb the compound on the plate, then washing with, for instance, water and drying. In the former, a coating solution containing the compound in a concentration ranging from 0.005 to 10% by weight can be applied by a variety of methods such as coating with a bar coater, whirler and spray or curtain coating, while in the latter method, the concentration of the solution ranges from 0.01 to 20% by weight, preferably 0.05 to 5% by weight and the dipping temperature ranges from 20° to 90° C., preferably 25° to 50° C. and the dipping time ranges from 0.1 second to 20 minutes, preferably 2 seconds to one minute.

The pH value of the solutions herein used may be adjusted to 1 to 12 with basic substances such as ammonia, triethylamine and potassium hydroxide or an acidic substances such as hydrochloric acid or phosphoric acid. Moreover, a yellow dye can be added for the improvement of tone reproduction of the PS plates.

The coated amount (weighed after drying) of the organic underlying layer suitably ranges from 2 to 200 mg/m$^2$, preferably 5 to 100 mg/m$^2$. This is because, if the coated amount is less than 2 mg/m$^2$, the printing durability of the resulting lithographic printing plate is insufficient, while if it exceeds 200 mg/m$^2$, sufficient printing durability cannot likewise be obtained.

Back Coat Layer

A coating layer of an organic polymer (hereinafter referred to as "back coat layer") may be applied onto the back face of the PS plate used in the present invention to prevent the liquidation of the anodized layer of aluminum and the occurrence of defects upon putting the PS plates in layers. Materials for the back coat layer are organic polymeric compounds insoluble in alkaline developers and preferred examples thereof are polyethylene, polypropylene, polybutene, polybutadiene, nylon, polyurethane, polyurea, polyimide, polysiloxane, polycarbonate, epoxy resin, condensed alkylphenol-/aldehyde resin, acetal resin, polyvinyl chloride, polyvinylidene chloride, polystyrene, acrylic resin and copolymer resins thereof.

The back coat layers may optionally comprise, in addition to these organic polymers, plasticizers, surfactants and other additives for imparting flexibility to the layer and for adjusting sliding properties. The amount of the plasticizers is up to about 30% by weight based on the total amount of the resin used in the layer.

The back coat layer further comprises a surfactant for improving, for instance, sliding properties, coating properties and adhesion to the support. Surfactants usable are cationic, anionic, nonionic and amphoteric ones.

The thickness of the back coat layer is generally selected such that the layer can prevent the liquidation of the anodized layer of the aluminum plate during development and preferably ranges from 0.01 to 50 μm, more preferably 0.05 to 10 μm.

The back coat layer can be applied to the back face of the aluminum support by various methods. For instance, it can be formed by a method comprising applying, onto the support, a solution or emulsion of the foregoing components in a proper solvent and then drying; a method comprising adhering a film prepared in advance to the support through an adhesive or application of heat; or a method comprising forming a melt film through a melt extruder and then adhering the film to the support with the first method being most preferred since it can ensure the thickness of the resulting film defined above.

First Organic Coating Layer

A first organic coating layer of a positive- or negative-working photosensitive composition is applied onto the hydrophilic surface of the aluminum support thus obtained. If a positive-working photosensitive composition is employed, there is formed a photosensitive first organic coating layer whose solubility in an aqueous alkaline solution is increased through the irradiation with light rays, while if a negative-working photosensitive composition is used, there is formed a photosensitive first organic coating layer whose solubility in an aqueous alkaline solution is decreased through the irradiation with light rays.

Positive-Working Photosensitive Composition

Examples of the principal component of the positive-working photosensitive composition are o-naphthoquinonediazide compounds. Preferred o-naphthoquinonediazide compounds are esters of 1,2-diazonaphthoquinonesulfonic acid with pyrogallolacetone resin as disclosed in J.P. KOKOKU No. Sho 43-28403 (U.S. Pat. No. 3,635,709). Other preferred o-quinonediazide compounds are, for instance, esters of 1,2-diazonaphthoquinone-5-sulfonic acid with phenol-formaldehyde resin as disclosed in U.S. Pat. Nos. 3,046,120 and 3,188,210; and esters of 1,2-diazonaphthoquinone-4-sulfonic acid with phenol-formaldehyde resin as disclosed in J.P. KOKAI Nos. Hei 2-96163, Hei 2-96165 and Hei 2-96761. Examples of other preferred o-n aphthoquinonediazide compounds include those known and disclosed in a variety of patents such as J.P. KOKAI Nos. Sho 47-5303, Sho 48-63802, Sho 48-63803, Sho 48-96575, Sho 49-38701 and Sho 48-13354, J.P. KOKOKU Nos. Sho 37-18015, Sho 41-11222, Sho 45-9610 and Sho 4917481, U S. Pat. Nos. 2,797,213: 3,454,400; 3,544,323; 3,573,917; 3,674,495 and 3,785,825; U.K. Patent Nos. 1, 227,602; 1,251,345; 1,267,005; 1,329,888 and 1,330,932; and German Patent No. 854,890.

Particularly preferred o-naphthoquinonediazide compounds are those obtained through the reaction of polyhydroxy compounds having molecular weight of not more than 1,000 with 1,2-diazonaphthoquinonesulfonic acid. Specific examples thereof are those disclosed in, for instance, J.P. KOKAI Nos. Sho 51-139402, Sho 58-150948, Sho 58-203434, Sho 59-165053, Sho 60-121445, Sho 60-134235, Sho 60-163043, Sho 61-118744, Sho 62-10645, Sho 62-10646, Sho 62-153950, Sho 62-178562 and Sho 64-76047; and U.S. Pat. Nos. 3,102,809; 3,126,281; 3,130,047; 3,148,983; 3,184,310; 3,188,210 and 4,639,406.

These o-naphthoquinonediazide compounds are preferably obtained by reacting polyhydroxy compounds with 1,2-diazonaphthoquinonesulfonic acid chloride in an amount ranging from 0.2 to 1.2 eq, more preferably 0.3 to 1.0 eq. The 1,2-diazonaphthoquinonesulfonic acid chloride may be either 1,2-diazonaphthoquinone-5-sulfonic acid chloride or 1,2-diazonaphthoquinone-4-sulfonic acid chloride.

In this respect, the resulting o-naphthoquinonediazide compound is a mixture of products variously differing in the positions of 1,2-diazonaphthoquinonesulfonate groups and the amounts thereof introduced, but preferred are those having a rate of the compound whose hydroxyl groups are all converted into 1,2-diazonaphthoquinonesulfonic acid esters (content of the completely esterified compound) of not less than 5 mole %, more preferably 20 to 99 mole%.

The photosensitive composition used in the invention preferably comprises the positive-working photosensitive compounds (inclusive of the foregoing combination) in an amount ranging from 10 to 50% by weight, but in the present invention, the photosensitive compound is preferably incorporated into the lower layer in a high concentration for reducing the thickness of the photosensitive layer and the amount of the component dissolved in a developer. Therefore, the amount of the o-quinonediazide compound is not less than 20% by weight, preferably not less than 30% by weight and more preferably not less than 40% by weight.

Positive-working photosensitive compounds usable in the invention in addition to the o-naphthoquinonediazide compounds further include, for instance, polymeric compounds having o-nitrocarbinol ester groups as disclosed in J.P. KOKOKU No. Sho 56-2696; and combinations of compounds generating acids through photolysis and compounds having —C—O—C or —C—O—Si groups capable of being dissociated by acids. Examples of such combinations are those comprising compounds generating acids through photolysis with acetal or O,N-acetal compounds (J.P. KOKAI No. Sho 48-89003), orthoester or amidoacetal compounds (J.P. KOKAI No. Sho 51-120714), polymers having, in the main chains, acetal or ketal groups (J.P. KOKAI No. Sho 53-133429), enol ether compounds (J.P. KOKAI No. Sho 55-12995), N-acyliminohydrocarbon compounds (J.P. KOKAI No. Sho 55-126236), polymers having, in the main chains, orthoester groups (J.P. KOKAI No. Sho 56-17345), silyl ester compounds (J.P. KOKAI No. Sho 60-10247) and silyl ether compounds (J.P. KOKAI Nos. Sho 60-37549 and Sho 60-121446).

Binders for Positive-Working Photosensitive Composition

The positive-working photosensitive composition may comprise only o-quinonediazide compounds such as those listed above, but preferably the o-quinonediazide compounds are used in combination with an alkaline water-soluble resin as a binder. Preferred examples thereof are alkaline water-soluble novolak resins such as phenol-formaldehyde resins and cresolformaldehyde resins, for instance, o-, m- and p-cresolformaldehyde resins, m-/p- mixed cresol-formaldehyde resins and phenol-mixed cresol (m-/ p-/o- or m-/p- or m-/o-)-formaldehyde resins.

Other binders usable in the invention further include phenol-modified xylene resins, polyhydroxystyrenes, halogenated polyhydroxystyrenes and acrylic resins having phenolic hydroxyl groups as disclosed in J.P. KOKAI No. Sho 51-34711. Examples of suitable binders may further include copolymers generally having a molecular weight of 10,000 to 200,000 and having structural units derived from the following monomers (1) to (13).

(1) (Meth)acrylamides, (meth)acrylic acid esters and hydroxystyrenes having an aromatic hydroxy group such as N-(4-hydroxyphenyl) (meth)acrylamide, o-, m- or p-hydroxystyrene and o-, m- or p-hydroxyphenyl-(meth)acrylate.

(2) (Meth)acrylic acid esters having an aliphatic hydroxy group such as 2-hydroxyethyl (meth)acrylate.

(3) Unsaturated carboxylic acids such as (meth)acrylic acid, maleic anhydride and itaconic acid.

(4) (Substituted) acrylates such as methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate and N-dimethylaminoethyl acrylate.

(5) (Substituted) methacrylates such as methyl methacrylate, ethyl methacrylate, propyl methacrylate, butyl methacrylate, amyl methacrylate, hexyl methacrylate, cyclohexyl methacrylate, octy methacrylate, phenyl methacrylate, benzyl methacrylate, 2-chloroethyl methacrylate, 4-hydroxybutyl methacrylate, glycidyl methacrylate and N-dimethylaminoethyl methacrylate.

(6) (Meth)acrylamides such as (meth)acrylamide, N-methylol (meth)acrylamide, N-ethyl (meth)acrylamide, N-hexyl (meth) acrylamide, N-cyclohexyl (meth)acrylamide, N-hydroxyethyl (meth)acrylamide, N-phenyl (meth)acrylamide, N-benzyl (meth) acrylamide, N-nitrophenyl (meth)acrylamide and N-ethyl-N-phenyl (meth)acrylamide.

(7) vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether.

(8) Vinyl esters such as vinyl acetate, vinyl chloroacetate, vinyl butyrate an vinyl benzoate.

(9) Styrenes such as styrene, methylstyrene and chloromethylstyrene.

(10) Vinyl ketones such as methyl vinyl ketone, ethyl vinyl ketone, propyl vinyl ketone and phenyl vinyl ketone.

(11) Olefins such as ethylene, propylene, isobutylene, butadiene and isoprene.

(12) N-vinyl pyrrolidone, N-vinyl carbazole, 4-vinyl pyridine, acrylonitrile and methacrylonitrile.

(13) Unsaturated sulfonamides of (meth)acrylamides such as N-(o-aminosulfonylphenyl) (meth)acrylamide, N-(m-a minosulfonylphenyl) (meth)acrylamide, N-(p-aminosulfonylphenyl) (meth)acrylamide, N-(1-(3-aminosulfonyl)naphthyl) (meth) acrylamide and N-(2-aminosulfonylethyl) (meth)acrylamide; and unsaturated sulfonamides of (meth)acrylic acid esters such as o-aminosulfonylphenyl (meth)acrylate, m-aminosulfonylphenyl (meth) acrylate, p-aminosulfonylphenyl (meth)acrylate and 1-(3-aminosulfonylnaphthyl) (meth)acrylate.

Further, the foregoing monomers may likewise be copolymerized with other monomers copolymerizable therewith and the copolymers of the monomers listed above can be modified with, for instance, glycidyl (meth)acrylate. However, the copolymers usable in the invention are not limited to these specific examples.

The foregoing copolymers preferably comprise moieties derived from the unsaturated carboxylic acids (3) listed above and the carboxylic acid value thereof preferably ranges from 0 to 10 meq/g, more preferably 0.5 to 5 meq/g. Moreover, the preferred molecular weight of these copolymers ranges from 10,000 to 100,000. The copolymers, if desired, may comprise polyvinyl butyral resin, polyurethane resin, polyamide resin and/or epoxy resin.

These alkali-soluble polymers may be used alone or in combination and the amount thereof is not more than 80% by weight on the basis of the total weight of the photosensitive composition.

The light-sensitive composition used in the invention preferably comprises, for the improvement of sensitivity, cyclic acid anhydrides, phenols and/or organic acids. Examples of such cyclic acid anhydrides are phthalic anhydride, tetrahydrophthalic anhydride, hexahydrophthalic anhydride, 3,6-endoxy- $\Delta^4$-tetrahydrophthalic anhydride, tetrachlorophthalic anhydride, maleic anhydride, chloromaleic anhydride, α-phenylmaleic anhydride, succinic anhydride and pyromellitic anhydride. Such phenols include, for instance, bisphenol A, p-nitrophenol, p-ethoxyphenol, 2,3,4-trihydroxybenzophenone, 4-hydroxybenzophenone, 2,4,4'-trihydroxybenzophenone, 4,4',4''-trihydroxy-triphenylmethane and 4,4',3'',4''-tetrahydroxy-3,5,3', 5'-tetramethyltriphenylmethane. Such organic acids are, for instance, sulfonic acids, sulfinic acids, alkylsulfuric acids, phosphonic acids, phosphinic acids, phosphoric acid esters and carboxylic acids as disclosed in J.P. KOKAI Nos. Sho 60-88942 and Hei 2-96755 and specific examples thereof are p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluylic acid, 3,4-dimethoxybenzoic acid, phthalic acid, terephthalic acid, 1,4-cyclohexene-2,2-dicarboxylic acid, erucic acid, lauric acid, n-undecanoic acid and ascorbic acid The content of the foregoing cyclic acid anhydrides, phenols and/or organic acid in the photosensitive composition preferably ranges from 0.05 to 15% by weight and more preferably 0.1 to 5% by weight.

The composition used in the invention may further comprise, for extending the development latitude, non-ionic surfactants as disclosed in J.P. KOKAI No. Sho 62-251740 and Japanese Patent Application Serial (hereinafter referred to as "J.P.A.") No. Hei.2-181248 and/or amphoteric surfactants as disclosed in J.P. KOKAI No. Sho 59-121044 and Hei 4-13149. Specific examples of non-ionic surfactants are sorbitan tristearate, sorbitan monopalmitate, sorbitan trioleate, stearyl monoglyceride, polyoxyethylene sorbitan monooleate and polyoxyethylene nonylphenyl ether and examples of amphoteric surfactants are alkyl di(aminoethyl)glycine, alkyl polyaminoethyl glycine hydrochloride, 2-alkyl-N-carboxyethyl-N-hydroxyethyl imidazolinium betaine and Amorgen K (trade name of an N-tetradecyl-N,N-betaine type surfactant, available from Dai-Ichi Kogyo Seiyaku Co., Ltd.) and Rebon 15 (trade name of an alkyl imidazoline type surfactant available from Sanyo Chemical Industries, Ltd.).

The content of the foregoing non-ionic and/or amphoteric surfactants in the composition ranges from 0.05 to 15% by weight and more preferably 0.1 to 5% by weight.

The positive-working photosensitive composition used in the invention may comprise a printing out agent for obtaining a visible image immediately after exposure to light, a dye or pigment for coloring images and other fillers. A representative example of the printing out agent is a combination of a photosensitive compound capable of releasing an acid through exposure to light with a salt-forming organic dye, for instance, a combination of o-naphthoquinonediazido-4-sulfonic acid halide with a salt-forming organic dye as disclosed in J.P. KOKAI Nos. Sho 50-36209 (=U.S. Pat. No. 3,969,118) and Sho 53-8128; and a combination of a trihalomethyl compound with a salt-forming organic dye as disclosed in J.P. KOKAI Nos. Sho 53-36223 (=U.S. Pat. No. 4,160,671), Sho 54-74728 (=U S. Pat. Nos. 4,232,106), Sho 60-3626, Sho 60-138539, Sho 61-143748, Sho 61-151644 and Sho 63-58440 (=U.S. Pat. No. 5,064,741). Such trihalomethyl compounds include oxadiazole and triazine type compounds and both of these are excellent in stability with time and can provide clear printed out images.

Other dyes may also be used instead of or together with the foregoing salt-forming organic dyes as the agents for coloring images. Preferred dyes inclusive of the salt-forming organic dyes are, for instance, oil-soluble and basic dyes. Specific examples thereof are Oil Yellow #101 and #103, Oil Pink #312, Oil Green BG, Oil Blue BOS and #603, Oil Black BY, BS and T-505 (they are all available from Orient Chemical Industries, Co., Ltd.), Victoria Pure Blue, Crystal Violet (CI 42555), Methyl Violet (CI 42535), Ethyl Violet, Rhodamine B (CI 145170B), Malachite Green (CI 42000) and Methylene Blue (CI 52015). Particularly preferred are those disclosed in J.P. KOKAI No. Sho 62-293247 (=GB 2192729).

These printing out agents and dyes ma be added to the second organic coating layer as will be detailed below or both first and second organic coating layers. The positive-working photosensitive composition used in the invention is dissolved in a solvent in which the foregoing components are soluble and then applied onto the aluminum support. Examples of solvents used herein are organic solvents as disclosed in J.P. KOKAI No. Sho 62-251739 which may be used alone or in combination.

The positive-working photosensitive composition is dissolved and dispersed in the solvent in a concentration ranging from 0.2 to 20% by weight (solid content), applied to the support and then dried. The coated amount of the positive-working photosensitive composition layer (photosensitive layer) applied onto the support varies depending on the applications of the resulting plate, but preferably ranges from 0.03 to 2.0 g/m² (weighed after drying), more preferably 0.2 to 1.5 g/m². As the coated amount decreases, the amount thereof dissolved in a developer is reduced, but the removal of the second or9anic coating layer from the support becomes difficult. On the other hand, as it is increased, the second organic coating layer is easily be removed from the support, but the amount thereof dissolved in the developer increases and the deterioration of the developer is accelerated.

The positive-working photosensitive composition may comprise a surfactant such as a fluorine atom-containing surfactant as disclosed in J.P. KOKAI No. Sho 62-170950 (=U.S. Pat. No. 4,822,713) for improving the coating properties thereof. The amount thereof to be added preferably ranges from 0.001 to 1.0% by weight, more preferably 0.005 to 0.5% by weight on the basis of the total weight of the composition.

Negative-Working Photosensitive Composition

Examples of negative-working photosensitive composition used in the invention are photosensitive compositions comprising photosensitive diazo compounds, photopolymerizable photosensitive compositions and photocrosslinkable photosensitive compositions. Among these, photohardenable photosensitive compositions will be detailed below by way of example.

The photosensitive diazo compounds used in the negative-working photosensitive copying material of the invention are, for instance, diazo resins obtained through condensation of aromatic diazonium salts with reactive carbonyl group-containing organic condensation agents, in particular, aldehydes such as formaldehyde and acetaldehyde or acetals in acidic mediums, with a condensate of p-diazodiphenylamine with formaldehyde being most typical example thereof. Methods for synthesizing these diazo resins are detailed in, for instance, U.S. Pat. Nos. 2,679,498; 3,050,502; 3,311,605 and 3,277,074.

There have been known diazo resins in which the counteranions of these diazonium salts are inorganic anions such as those derived from mineral acids, e.g., hydrochloric acid, hydrobromic acid, sulfuric acid and phosphoric acid or complex salts thereof with zinc chloride. However, particularly preferred are diazo resins which are substantially insoluble in water and soluble in organic solvents. Such preferred diazo resins are detailed in J.P. KOKOKU No. Sho 47-1167 and U.S. Pat. No. 3,300,309.

Moreover, preferred diazo resins further include, for instance, those having counteranions derived from halogenated Lewis acids such as tetrafluoroboric acid, hexafluorophosphoric acid and perhalogenic acids such as periodic acid as disclosed in J.P. KOKAI Nos. Sho 54-98613 and Sho 56-121031. In addition, preferred diazo resins also include diazo resins having counteranions derived from sulfonic acid carrying long chain alkyl groups as disclosed in J.P. KOKAI Nos. Sho 58-209733, Sho 62-175731 and Sho 63-262643.

The amount of the photosensitive diazo compounds usually ranges from 5 to 50% by weight, in general 8 to 20% by weight on the basis of the total weight of the photosensitive layer, but in the present invention, the photosensitive compound is preferably incorporated into the lower photosensitive layer in a high concentration for reducing the thickness of the photosensitive layer and the amount of the component dissolved in a developer. Therefore, the amount of the diazo compound is preferably not less than 30% by weight and more preferably 50 to 100% by weight on the basis of the total weight of the solid contents of the photosensitive layer.

Binders Used in Negative-Working Photosensitive Composition

The photosensitive diazo compounds used in the invention are preferably used in combination with alkaline water-soluble or swellable lipophilic polymer materials as binders. Examples of such lipophilic polymeric compounds are the same copolymers listed above in connection with the positive-working photosensitive copying materials and having repeating units derived from the monomers (1) to (13) and molecular weights generally ranging from 10,000 to 200,000 as well as those having repeating units derived from the following monomers (14) and (15):

(14) unsaturated imides such as maleimide, N-acryloyl(meth) acrylamide, N-acetyl(meth)acrylamide, N-propionyl(meth) acrylamide and N-(p-chlorobenzoyl) (meth)acrylamide.

(15) unsaturated monomers having, on the side chains, crosslinkable groups such as N-(2-((meth)acryloyloxy)ethyl)-2,3-dimethylmaleimide and vinyl cinnamate.

Further, other monomers copolymerizable with the foregoing monomers may be copolymerized. Moreover, the binders also include copolymers obtained by copolymerization of the foregoing monomers which are further modified with glycidyl (meth)acrylate. However, the present invention is not restricted to these specific binders.

The foregoing copolymers preferably comprise moieties derived from the unsaturated carboxylic acids (3) listed above and the acid value thereof preferably ranges from 0 to 10 meq/g, more preferably 0.2 to 5.0 meq/g. Moreover, the preferred molecular weight of these copolymers ranges from 10,000 to 100,000. The copolymers, if desired, may comprise polyvinyl butyral resin, polyurethane resin, polyamide resin and/or epoxy resin.

Other preferred binders are novolak type resins such as phenol/formaldehyde resin, o-, m- and p-cresol/formaldehyde resins, m-/p-mixed cresol/formaldehyde resins and phenol/cresol (o-/m-/p-, m-/p- or o-/m-mixed cresol)/formaldehyde resins. Moreover, usable binders further include, for instance, phenol-modified xylene resins, polyhydroxystyrene, halogenated polyhydroxystyrene and alkali-soluble resins having phenolic hydroxyl groups as disclosed in J.P. KOKAI No. Sho 51-34711.

These alkali-soluble polymers may be used alone or in combination and the amount thereof ranges from 0 to 80% by weight, preferably 0 to 50% by weight based on the total weight of the solid contents of the photosensitive composition.

The negative-working photosensitive composition used in the invention may optionally comprise a plasticizer for improving the flexibility and wear resistance of the resulting coating layer. Specific examples thereof are butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate and oligomers and polymers of (meth) acrylic acid, with tricresyl phosphate being particularly preferred.

The negative-working photosensitive composition used in the invention may comprise, for the improvement of stability with time, additives such as phosphoric acid, phosphonic acid, citric acid, oxalic acid, dipicolinic acid, benzenesulfonic acid, naphthalenesulfonic acid, sulfosalicylic acid, 4-methoxy-2-hydroxybenzophenone-5-sulfonic acid and tartaric acid.

The negative-working photosensitive composition used in the invention may comprise a printing out agent for obtaining a visible image immediately after imagewise exposure to light and/or agents for coloring images such as dyes or pigments.

Representative printing out agents are combinations of compounds releasing acids through exposure to light (photolytically acid-releasing agents) with salt-forming organic dyes. Specific examples thereof are combinations of trihalomethyl compounds with salt-forming organic dyes as disclosed in J.P. KOKAI Nos. Sho 53-36223 (=U.S. Pat. No. 4,160,671), Sho 54-74728 (=U.S. Pat. No. 4,232,106), Sho 60-3626, Sho 61-143748, Sho 61-151644 and Sho 63-58440 (=U.S. Pat. No. 5,064,741). Such trihalomethyl compounds include oxazole and triazine type compounds and both of these are excellent in stability with time and can provide clear printed out images.

The dyes are preferably those which change color tone through the reaction with free radicals or acids. Specific examples thereof which are initially colored and converted into colorless ones, or which cause color change are triphenylmethane, diphenylmethane, oxazine, xanthene, iminonaphthoquinone, azomethine or anthraquinone type dyes such as oil-soluble and basic dyes. Specific examples thereof are Victoria Pure Blue (available from Hodogaya Chemical Co., Ltd.), Oil Yellow #101 and #103, Oil Pink #312, Oil Red, Oil Green BG, Oil Blue BOS and #603, Oil Black BY, BS and T-505 (they are all available from Orient Chemical Industries, Co., Ltd.), Patent Pure Blue (available from Sumitomo Mikuni Chemical Co., Ltd.), Crystal violet (CI 42555), Methyl Violet (CI 42535), Ethyl Violet, Rhodamine B (CI 145170B), Malachite Green (CI 42000), Methylene Blue (CI 52015), Brilliant Blue, Methylene Green, Erythrosine B, Basic Fuchsine, m-Cresol Purple, Auramine, 4-p-diethylaminophenyl iminonaphthoquinone, cyano-p-diethylaminophenyl acetanilide.

On the other hand, examples of dyes which are initially colorless and converted into colored ones are leuco dyes and primary and secondary arylamine type dyes such as triphenylamine, diphenylamine, 0-chloroaniline, 1,2,3-triphenylguanidine, naphthylamine, diaminodiphenylmethane, p,p'-bis-dimethylaminodiphenylamine, 1,2-dianilinoethylene, p,p', p"-tris-dimethylaminotriphenylmethane, p,p'-bis-dimethylaminodiphenylmethylimine, p,p',p"-triamino-o-methyltriphenylmethane, p,p'-bis-dimethylaminodiphenyl-4-anilinonaphthylmethane and p,p',p"-triaminotriphenylmethane.

Preferred are triphenylmethane and diphenylmethane type ones, more preferred are triphenylmethane type dyes, in particular Victoria Pure Blue BOH. The foregoing dyes are used in an amount preferably ranging from about 0.5 to 10% by weight, more preferably about 1 to 5% by weight based on the total weight of the negative-working photosensitive composition.

These printing out agents and dyes may be added to the second, organic coating layer as will be detailed below or both the first and second organic coating layers.

The negative-working photosensitive composition used in the invention may comprise cyclic acid anhydrides, phenols, organic acids and/or higher alcohols. These additives are the same as those listed above in connection with the positive-working photosensitive composition and used in the same amount defined above.

The negative-working photosensitive composition is dissolved in a solvent in which the foregoing components are soluble and then applied onto the aluminum support. Examples of such solvents used herein are preferably those disclosed in, for instance, J.P. KOKAI Nos. Sho 62-38471 and Sho 63-259558 and European Patent No. 410,277.

The negative-working photosensitive composition is dissolved or dispersed in the solvent in a concentration ranging from 0.2 to 20% by weight (solid content), applied to the support and then dried. The coated amount of the layer of the negative-working photosensitive composition (photosensitive layer) applied onto the support varies depending on the applications of the resulting plates, but preferably ranges from 0.03 to 2.0 g/m$^2$, more preferably 0.2 to 1.5 g/m$^2$ (weighed after drying). As the coated amount decreases, the amount of the layer dissolved in a developer is reduced, but the removal of the second organic coating layer becomes difficult. On the other hand, as it is increased, the second organic coating layer can easily be removed, but the amount thereof dissolved in the developer increases and the deterioration of the developer is thus accelerated.

The negative-working photosensitive composition may comprise a surfactant such as a fluorine atom-containing surfactant as disclosed in J.P. KOKAI No. Sho 62-170950 (=U.S. Pat. No. 4,822,713) for improving the coating properties thereof. The amount thereof to be added preferably ranges from 0.001 to 1% by weight, more preferably 0.005 to 0.5% by weight on the basis of the total weight of the composition.

Second Organic Coating Layer

The photosensitive copying material of the invention comprises a second organic coating layer which is substantially insoluble in developers (hardly soluble in a developer) and capable of permeating the developer (developer permeable) and which is applied onto the photosensitive layer of the foregoing first organic coating layer. In the present invention, the second organic coating layer can be formed by applying, on the first organic coating layer, an emulsion in which a water-insoluble and film-forming polymeric compound is emulsified and dispersed in water and then drying the coated layer. The film obtained from the emulsion preferably has toughness and wear resistance as well as a hydrophobic surface easily receiving a printing ink. A latex of a lipophilic polymeric compound is used as the foregoing emulsion.

The polymeric compounds useful for forming the second organic coating layer of the invention are, for instance, homopolymers and copolymers of monomers selected from the following group A; copolymers of at least one monomer of the following group A and at least one monomer of the following group B; and polymers of at least one monomer selected from the following group C:

Group A: Monomers represented by the following general formula:

$$CHX=CYZ$$

wherein X represents a hydrogen atom, a methyl group or a group —COOR$^1$; Y represents a hydrogen or halogen atom or methyl, — C(CH$_2$)$_n$ COOR$^2$ or nitrile group; Z represents an aryl, heterocyclic, —COOR$^3$, —OR$^3$, —O—COR$^3$, —CONR$^3$ or nitrile group or a halogen atom; R$^1$, R$^2$ and R$^3$ may be the same or different and each represents an aliphatic or aromatic group; and n is an integer ranging from 0 to 3.

Group B: ethylenic monomers having at least one free carboxylic acid residue, sulfonic acid residue, phosphoric acid residue or a salt thereof; and hydroxyalkyl esters and amides of the carboxylic acids.

Group C: divinylic monomers.

In the general formula representing the monomers of Group A, the aliphatic groups of R$^1$ to R$^3$ are linear or branched alkyl groups (including cyclic ones) and substituted alkyl groups. The alkyl groups preferably have 1 to 12 carbon atoms.

Examples of substituents for the alkyl groups are aryl, aryloxy, cyano, acyl, alkylcarbonyloxy, arylcarbonyloxy, amino, (inclusive of substituted amino, the substituents being, for instance, alkyl and aryl groups and the number thereof is 1 to 2), hydroxyl, alkoxy, heterocyclic (examples of the hetero atoms are oxygen, nitrogen and sulfur atoms, the number of members of the ring is preferably 5 to 6, they may be saturated or unsaturated ones and may be condensed with aromatic rings) groups and halogen atoms.

Among the groups represented by R$^1$ to R$^3$, the aryl groups of course include substituted phenyl or naphthyl groups and examples of the substituents are those listed above in connection with the substituted alkyl groups, and alkyl groups.

Examples of aryl groups represented by Z are phenyl and naphthyl groups which may have substituents selected from those listed above in connection with the substituted alkyl groups, and alkyl groups (preferably those having 1 to 12 carbon atoms).

The heterocyclic groups represented by Z are, for instance, 5- or 6-membered ones having oxygen, nitrogen and/or sulfur atoms as the hetero atoms, which may be further condensed with hydrocarbon or heterocyclic rings. Specific examples thereof are oxazolidone, pyridine, picoline, imidazole, triazole, pyrrolidone, pyrazole, carbazole, thiophene, succinimide, glutarimide, adipimide, piperidone, caprolactam and pyridone from which a hydrogen atom is removed, with those bonded to a vinyl group at the N-position being preferred.

Monomers of Group A include, for instance, monofunctional monomers such as (meth)acrylates, crotonates, vinyl esters, maleic acid diesters, fumaric acid diesters, itaconic acid diesters and styrenes.

Specific examples thereof are methyl acrylate, ethyl acrylate, n-propyl acrylate, isopropyl acrylate, n-butyl acrylate, isobutyl acrylate, sec-butyl acrylate, amyl acrylate, hexyl acrylate, 2-ethylhexyl acrylate, octyl acrylate, tertoctyl acrylate, 2-phenoxyethyl acrylate, 2-chloroethyl acrylate, 2-bromoethyl acrylate, 4-chlorobutyl acrylate, cyanoethyl acrylate, 2-acetoxyethyl acrylate, dimethylaminoethyl acrylate, benzyl acrylate, methoxybenzyl acrylate, 2-chlorocyclohexyl acrylate, cyclohexyl acrylate, furfuryl acrylate, tetrahydrofurfuryl acrylate, phenyl acrylate, 5-hydroxypentyl acrylate, 2,2-dimethyl-3-hydroxypropyl acrylate, 2-methoxyethyl acrylate, 3-methoxybutyl acrylate, 2-ethoxyethyl acrylate, 2-iso-propoxyethyl acrylate, 2-butoxyethyl acrylate, 2-(2-methoxyethoxy)ethyl acrylate, 2-(2-butoxyethoxy)ethyl acrylate, 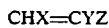methoxypolyethylene glycol acrylate (added molar number n=9), 1-bromo-2-methoxyethyl acrylate, 1,1-dichloro- 2-ethoxyethyl acrylate, methyl methacrylate, ethyl methacrylate, n-propyl methacrylate, isopropyl methacrylate, n-butyl methacrylate, isobutyl methacrylate, sec-butyl methacrylate, amyl methacrylate, hexyl methacrylate, cyclohexyl methacrylate, chlorobenzyl methacrylate, benzyl methacrylate, octyl methacrylate, N-ethyl-N-phenylaminoethyl methacrylate, 2-(3-phenylpropyloxy)ethyl methacrylate, dimethylaminophenoxyethyl methacrylate, furfuryl methacrylate, tetrahydrofurfuryl methacrylate, phenyl methacrylate, cresyl methacrylate, naphthyl methacrylate, 2-hydroxyethyl methacrylate, 3-hydroxypropyl methacrylate, 4-hydroxybutyl methacrylate, triethylene glycol monomethacrylate, dipropylene glycol monomethacrylate, 2-methoxyethyl methacrylate, 3-methoxybutyl methacrylate, 2-acetoxyethyl methacrylate, acetoacetoxyethyl methacrylate, 2-ethoxyethyl methacrylate, 2-isopropoxyethyl methacrylate, 2-butoxyethyl methacrylate, 2-(2-methoxyethoxy)ethyl methacrylate, 2-(2-ethoxyethoxy)ethyl methacrylate, 2-(2-butoxyethoxy)ethyl methacrylate, ω-methoxypolyethylene glycol methacrylate (added molar number n=6), vinyl acetate, vinyl propionate, vinyl butyrate, vinyl isobutyrate, vinyl dimethyl propionate, vinyl ethylbutyrate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl-β-phenylbutyrate, vinyl c yclohexylcarboxylate, vinyl benzoate, vinyl salicylate, vinyl chlorobenzoate, vinyl tetrachlorobenzoate, vinyl naphthoate, styrene, methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, acetoxymethylstyrene, methoxystyrene, 4-methoxy-3-methylstyrene, dimethoxystyrene, chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene, methyl vinylbenzoate, butyl crotonate, hexyl crotonate, glycerin monocrotonate, dimethyl itaconate, diethyl itaconate, dibutyl itaconate, diethyl maleate, dimethyl maleate, dibutyl maleate, diethyl fumarate, dihexyl fumarate, fumaric acid dibutylmethyl acrylamide, ethyl acrylamide, propyl acrylamide, isopropyl acrylamide, butyl acrylamide, tert-butyl acrylamide, heptyl acrylamide, tert-octyl acrylamide, cyclohexyl acrylamide, benzyl acrylamide, hydroxymethyl acrylamide, methoxyethyl acrylamide, dimethylaminoethyl acrylamide, hydroxyethyl acrylamide, phenyl acrylamide, hydroxyphenyl acrylamide, tolyl acrylamide, naphthyl acrylamide, dimethyl acrylamide, diethyl acrylamide, dibutyl acrylamide, diisobutyl acrylamide, N-(1,1-dimethyl-3-oxobutyl)acrylamide, methylbenzyl acrylamide, benzyloxyethyl acrylamide, β-cyanoethyl acrylamide, acryloyl morpholine, N-methyl-N-acryloylpiperazine, N-acryloylpiperidine, N-(1,1-dimethyl-3-hydroxybutyl)acrylamide, N- β-morpholinoethyl acrylamide, N-acryloylhexamethyleneimine, N-hydroxyethyl-N-methyl acrylamide, N-2-acetamidoethyl-N-acetyl acrylamide, methyl methacrylamide, tert-butyl methacrylamide, tert-octyl methacrylamide, benzyl methacrylamide, cyclohexyl methacrylamide, phenyl methacrylamide, dimethyl methacrylamide, diethyl methacrylamide, dipropyl methacrylamide, hydroxyethyl-N-methyl methacrylamide, N-methyl-N-phenyl methacrylamide, N-ethyl-N-phenyl methacrylamide and methacryl hydrazine;

Allyl compounds such as allyl acetate, allyl caproate, allyl caprylate, allyl laurate, allyl palmitate, allyl stearate, allyl benzoate, allyl acetoacetate, allyl lactate, allyl oxyethanol, allyl butyl ether and allyl phenyl ether;

Vinyl ethers such as methyl vinyl ether, butyl vinyl ether, hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether and dimethylaminoethyl vinyl ether;

Vinyl ketones such as methyl vinyl ketone, phenyl vinyl ketone and methoxyethyl vinyl ketone;

Olefins, for instance, unsubstituted hydrocarbons such as dicyclopentadiene, ethylene, propylene, 1-butene, 1-pentene, 1-hexene, 4-methyl-1-pentene, 1-heptene, 1-octene, 1-decene, 5-methyl-1-nonene, 5,5-dimethyl-1-octene, 4-methyl-1-hexene, 4,4-dimethyl-1-pentene, 5-methyl-1-hexene, 4-methyl-1-heptene, 5-methyl-1-heptene, 4,4-dimethyl-1-hexene, 5,5,6-trimethyl-1-heptene, 1-dodecene and 1-octadecene; and diene compounds such as butadiene, isoprene and chloroprene;

vinyl heterocyclic compounds (heteroatoms are, for instance, nitrogen, oxygen and sulfur atoms; the hetero rings are, for instance, 5- and 6-membered ones to which aromatic rings may further be bonded), for instance, N-vinyloxazolidone, vinylpyridine, vinylpicoline, N-vinylimidazole, N-vinyl-2-methylimidazole, N-vinyltriazole, N-vinyl-3,5-dimethyltriazole, N-vinylpyrrolidone, N-vinyl-3,5-dimethylpyrazole, N-vinylcarbazole, vinylthiophene, N-vinylsuccinimide, N-vinylglutarimide, N-vinyladipinimide, N-vinylpyrrolidone, N-vinylpiperidone, N-vinyl-ε-caprolactam and N-vinyl-2-pyridone;

Unsaturated nitriles such as acrylonitrile and methacrylonitrile: and

Halogenated vinyl compounds such as vinyl chloride, vinylidene chloride, vinyl bromide and vinyl iodide.

Examples of the monomers of Group B are monofunctional monomers such as (meth)acrylic acid, itaconic acid, maleic acid, monoalkyl itaconates (e.g., monomethyl itaconate, monoethyl itaconate and monobutyl itaconate), monoalkyl maleates (e.g., monomethyl maleate, monoethyl maleate, monobutyl maleate and monooctyl maleate), citraconic acid, styrenesulfonic acid, vinylbenzylsulfonic acid, vinylsulfonic acid, ac ryloyloxyalkylsulfonic acids (e.g., acryloyloxymethylsulfonic acid, acryloyloxyethylsulfonic acid, acryloyloxypropylsulfonic acid and acryloyloxybutylsulfonic acid), methac ryloyloxyalkylsulfonic acids (e.g., methacryloyl oxymethylsulfonic acid, methacryloyloxyethylsulfonic acid, methacryloyloxypropylsulfonic acid and methacry loyloxybutylsulfonic acid), acrylamidoalkylsulfonic acids (e.g., 2-acrylamido-2-methylethanesulfonic acid, 2-acrylamido-2-methylpropanesulfonic acid and 2-acrylamido-2-me thylbutanesulfonic acid), acryloyloxyalkylsulfates (e.g., acryloyloxyethylsulfate and 3-acryloyloxypropylsulfate) and methacryloyloxyalkylphosphate (e.g., methacryloy loxyethylphosphate and 3-methacryloyloxypropylphosphate).

The alkyl groups for the foregoing acidic monomers are, for instance, those having about 1 to 8 carbon atoms. These acids may be in the form of salts with alkali metal ions (preferably Na+ and K+) or ammonium ion.

Examples of the monomers of Group C are unsaturated esters of polyols, in particular esters of α-methylene carboxylic acid, such as ethylene di(meth)acrylate, diethylene glycol di(meth)acrylate, glycerol di(meth)acrylate, glycerol tri(meth) acrylate, 1,3-propylene di(meth)acrylate, 1,4-cyclohexanediol (meth)acrylate, 1,4-benzenediol di(meth)acrylate, pentaerythritol tetra(meth)acrylate, 1,3-propylene glycol di(meth)acrylate, 1,5-pentanediol di(meth)acrylate, trimethylolpropane tri(meth)acrylate; unsaturated amides, in particular those of α-methylene carboxylic acid, α, ω-diamines and ω-diamines in which oxygen atoms are interposed, such as methylenebis(meth)acrylamide, ethylenebis(meth) acrylamide, 1,6-hexamethylenebis(meth)acrylamide and diethylenetriaminetris(meth)acrylamide; vinyl esters such as divinyl succinate, divinyl adipate, divinyl phthalate, divinyl terephthalate, divinylbenzene-1,3-disulfonate and divinylbutane-1,4-disulfonate; unsaturated aldehydes such as sorbaldehyde, i.e., 2,4-hexadienal;

Neutral α-methylenecarboxylic acid polyesters, polyamides such as (meth)acrylates and (meth)acrylamides and/or ester amides of primary and secondary aminoalcohols, aminopolyols or polyaminoalcohols or polyols and esteramides of homologous derivatives of the foregoing alcohols such as β-methacrylamidoethyl (meth)acrylamide, N-(β-hydroxyethyl)-β-(methacrylamido)ethyl acrylate, N,N-bis(β-methacryloxyethyl) acrylamide; urethane compounds derived from divinyl benzene and xylylenediisocyanate with hydroxyethyl (meth)acrylate such as those derived from isocyanates and hydroxyalkyl compounds, e.g., that represented by the following structural formula:

with nitrogen gas. Then 33.37 g of acrylonitrile, 145.3 g of vinylidene chloride, 14.1 g of acrylic acid and 14.1 g of Triton 770 (surfactant) are added to the flask, then 0.45 g of potassium persulfate is added and the reaction is carried out at a temperature of 30° C. with stirring at 150 rpm.

It is also possible to use, as the lipophilic resins, those whose latexes cannot be obtained by emulsion polymerization, for instance, acetal resins such as formal and butyral resins; cellulose esters such as cellulose acetate, cellulose propionate, cellulose butyrate and cellulose crotonate; co-ester compounds of these ester compounds with dicarboxylic acids such as phthalic acid, succinic acid, sebacic acid and maleic acid; cellulose ether compounds such as methyl cellulose, ethyl cellulose, propyl cellulose, butyl cellulose, allyl cellulose, benzyl cellulose, cyclohexyl cellulose and cyanoethyl cellulose; and polymers obtained through condensation/polymerization such as polyesters, polyamides, polyurethanes, polyureas and polyimides. The emulsions of these compounds can be prepared by the method disclosed in J.P. KOKAI No. Sho 52-3653.

The relative amounts of these monomers of Groups A, B and C can appropriately be selected while taking into consideration the developability, ink receptivity and printing durability of the coated second organic layer. The monomer component of Group A principally contributes to ink receptivity and printing durability. Therefore, the amount of the monomer component of Group A preferably ranges from 20 to 100% by weight, in particular 60 to 100% by weight on the basis of the weight of the solid content of the polymer. That of the monomer component of Group B preferably ranges from 0 to 25% by weight, in particular 0 to 10% by weight on the basis of the weight of the solid content

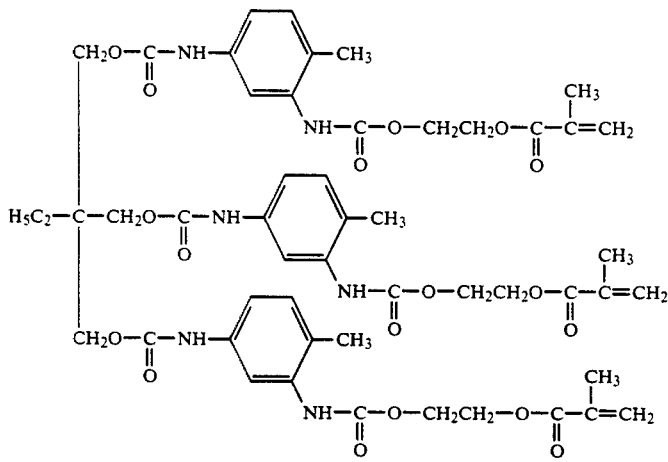

In the foregoing compounds, the term "(meth)acrylate" includes both "acrylate" and "methacrylate". The term "(meth)acrylamide" likewise includes both "acrylamide" and "methacrylamide".

The latex polymer used in the formation of the second organic coating layer in the present invention can be prepared by the emulsion polymerization as detailed in Preparative Methods of Polymer Chemistry, Interscience Publishers, pp. 216 and 238. One example thereof is as follows: To one liter volume three-necked flask, there are added 420 ml of distilled water and 0.225 g Of potassium metabisulfite, followed by stirring the mixture to dissolve the metabisulfite and purging the flask of the polymer and that of the monomer component of Group C preferably ranges from 0 to 80% by weight, in particular 0 to 40% by weight on the basis of the weight of the solid content of the polymer.

In addition to the foregoing copolymeric compounds, it is likewise preferred to use acetal resins such as formal, resin and butyral resins; cellulose esters such as cellulose acetate, cellulose propionate, cellulose butyrate and cellulose crotonate; co-ester compounds of these ester compounds with dicarboxylic acids such as phthalic acid, succinic acid, sebacic acid and maleic acid; cellulose ether compounds such as methyl cellulose, ethyl cellulose, propyl cellulose, butyl cellulose, allyl cellulose, benzyl cellulose, cyclohexyl cellulose and cyanoethyl cellulose; polyesters, polyamides, polyurethanes, polyureas, polyimides, epoxy resins, alkylphenol/aldehyde condensed resins and shellac. These polymeric compounds each preferably comprises at least one group, in the main chain or on the side chains, selected from the group consisting of hydroxyl, amino, amido, imino, imido, nitrilo, carboxyl, sulfonyl, sulfonyloxy, isocyanate, urethane, azoimido, azo, hydrazino, carbamido, carbamyl, epoxy, mercapto, thio and sulfonamido groups.

The polymeric compounds used in the invention distribute in a wide range extending from oligomers to high molecular weight polymers having a molecular weight ranging from about 2,000 to about 200,000. These polymers may be used alone or in combination. The permeability and swellability of the resulting second organic coating layer with respect to developers as well as film-forming properties of the emulsions can be controlled if the polymers are used in combination.

In the invention, commercially available latexes may also be used. Examples thereof are emulsions of copolymers of polyacrylic acid esters such as JULIMER ET-410, SEK-301, SEK-101, FC-30, FC-60, FC-80, SE-5101, SE-5102, SE-5103, SE-5301, SE-361, SE-363, SE-365, SE-6302, SE-6311 and SE-6312 (the trade names; available from Nippon Pure Chemicals, Co., Ltd.), Nipol LX811, LX814, LX841, LX851, LX852, LX-854, LX856, LX860 and LX874 (available from Nippon Zeon Co., Ltd.), and PRIMAL AC-22, AC-33, AC-3444, AC-55, AC-61, AC-382, ASE-60, ASE-75, ASE-108, B-15, B-41, B-74, B-336, B-505, B-832, B-924, C-72, E-32, E-358, HA-8, HA-16, HA-24, I-94, LC-40, LT-76, LT-87, MC-4530, N-580, P-6N, P-1060, S-1, TR-49 and 850 (available from Nippon Acryl Chemical Co., Ltd.); acrylonitrile/butadiene type latexes such as Nipol 1551, 1561, 1562, 1571, 1577, LX511, LX513, LX531 and LX531B (available from Nippon Zeon Co., Ltd.); styrene/butadiene type latexes such as Nipol LX111, 4850, 4850A, LX110, LX119, LX204, LX206, LX209, 2507, LX303, 2518FS, LX415A, LX426, LX430, LX432A, LX433, LX472, 2570X5, LX407BP, LX407C, LX407F and LX407G (available from Nippon Zeon Co., Ltd.); vinyl chloride type latexes such as Geon 150X15, 351 and 576 (available from Nippon Zeon Co., Ltd.); urethane resin emulsions such as VONDIC 1041NS, 1050B-NS, 1230NS, 1250, 1310NSC, 1320NSC, 1510, 1610NS, 1512NSC, 1640, 1660NS, 1670NS, 1930A-NS, 1980NS, 1205, 2220 and 2230 (available from Dainippon Ink and Chemicals, Inc.), ARON NEOTHANE UE-1101, UE-1200, UE-1300, UE-1402, UE-2103, UE-2200, UE-2600, UE-29UO, UE-5404 and UE-5600 (available from Toagosei Chemical Industry Co., Ltd.); colloidal dispersion type urethane resins such as HYDRAN HW-301, HW-310, HW-311, HW-312B, HW-333, HW-340, HW-350, HW-111, HW-140, HW-910, HW-920, HW-930, HW-940, HW-950 and HW-960 (available from Dainippon Ink and Chemicals, Inc.). If commercially available latexes are employed, it should be noted that the quality thereof varies depending on the factors such as the kinds of emulsion stabilizers used.

The polymers (including those obtained by methods other than emulsion polymerization) for forming the second organic coating layer preferably have at least one group, in the main chain or on the side chains, selected from the group consisting of hydroxyl, amino, amido, imino, imido, nitrilo, carboxyl, sulfonyl, sulfonyloxy, isocyanate, urethane, azoimido, azo, hydrazino, carbamido, carbamyl, epoxy, mercapto, thio and sulfonamido groups. The particle size of the lipophilic resins in the emulsion is not restricted to a specific range, but in general ranges from about 0.03 to 10$\mu$m and preferably about 0.05 to 5$\mu$m. Wide variety of polymers which form emulsive particles and distribute in a wide range extending from oligomers to high molecular weight ones having a molecular weight ranging from about 2,000 to 200,000 may be used and they may be used in combination. The polymer per se for forming emulsive particles may be cross-linked or may be those capable of being hardened through irradiation with actinic light rays or application of heat.

The permeability and swellability of the resulting second organic coating layer with respect to developers as well as film-forming properties of the latexes can be controlled if these emulsions are used in combination.

The solubility of the second organic coating layer in the developer herein defined means that it is relative to the intensity of the developer. As has been well-known, the intensity of the developer for the o-quinonediazide photosensitive layer is varied depending on the composition of the photosensitive layer and thus a developer having an intensity adapted for a particular photosensitive layer can properly be selected. For this reason, the polymeric compounds for forming the second organic coating layer are not selected depending on the so-called solubility or swellability, but are selected depending on the choice of components of the first organic coating layer and those of the developer used.

The second layer may comprise the foregoing o-quinonediazide compound as a permeation-accelerating agent for developers, but the use thereof in an excess amount leads to an increase in the amount of the components in the second layer dissolved in the developer. Therefore, the amount of the o-quinonediazide compound to be added is preferably limited to not more than 20%.

Moreover, the second organic coating layer may optionally comprise various kinds of organic and/or inorganic additives such as dyes and pigments as agents for coloring images, printing out agents, fillers, e.g., titanium dioxide and clay for improving the physical strength of the resulting film, plasticizers for accelerating the development, and acid anhydrides, organic acids and phenols as discussed above in connection with the photosensitive layer.

The second layer may likewise optionally comprise a stabilizer, a surfactant and/or a plasticizer. In particular, it preferably comprises a surfactant for improving the coating properties such as a fluorine atom-containing surfactant as disclosed in J.P. KOKAI No. Sho 62-170950. The amount of the surfactant to be added preferably range from 0.001 to 1.0% by weight and more preferably 0.005 to 0.5% by weight on the basis of the total weight of the organic coating layer. In this respect, if the second organic coating layer is formed from an emulsion, these additives may be present in either outside or inside the emulsified particles.

The second organic coating layer can be formed by any coating technique such as coating or flow-coating of a solution, transfer method and simultaneous multilayer coating technique and then dried to give a desired layer. Examples of the solvents used in the coating step are organic solvents as disclosed in J. P. KOKAI No. Sho 62-251739 with alcohols and hydrocarbons which are poor solvents for the o-quinonediazide compounds being particularly useful.

Alternatively, the second organic coating layer may be formed by a melt lamination method or a thermal adhesion of a film.

The amount of the second organic coating layer to be applied preferably ranges from 0.1 to 5.0 g/m$^2$, more preferably 0.5 to 3.0 g/m$^2$ (weighed after drying). If the coated amount thereof is less than the lower limit, the intensity of the resulting image formed on the photosensitive copying material is insufficient, while if it exceeds the upper limit, it takes a long time till a developer permeates through the second layer and thus excellent images cannot be obtained

Mat Layer

A mat layer is preferably applied onto the surface of the second organic coating layer thus formed to reduce the time required for evacuation during contact exposure using a vacuum printing frame and to prevent the formation of an indistinct image during printing. Examples of such mat layers are disclosed in J.P. KOKAI No. Sho 50-125805 and J.P. KOKOKU Nos. Sho 57-6582 and Sho 61-28986. Alternatively, the mat layer can also be formed by heat-welding solid powder onto the surface of the second layer as disclosed in J.P. KOKOKU No. Sho 62-62337.

Actinic Light Rays

The photosensitive copying material thus prepared is imagewise exposed, through an original transparency, to actinic light from a light source such as a carbon arc lamp, a mercury lamp, a xenon lamp, a tungsten lamp or a metal halide lamp.

Developers

Alkali aqueous solutions commonly known can be used as developers for these photosensitive copying materials. Examples of the alkaline agents used in the developer composition of the present invention include inorganic alkaline agents such as sodium silicate, potassium silicate, sodium hydroxide, potassium hydroxide, lithium hydroxide, ammonium hydroxide, sodium tertiary phosphate, potassium tertiary phosphate, sodium secondary phosphate, potassium secondary phosphate, ammonium tertiary phosphate, ammonium secondary phosphate, sodium carbonate, potassium carbonate, ammonium carbonate, sodium bicarbonate, potassium bicarbonate, ammonium bicarbonate, sodium borate, potassium borate and ammonium borate; and organic alkaline agents such as monomethylamine, dimethylamine, trimethylamine, monoethylamine, diethylamine, triethylamine, monoisopropylamine, diisopropylamine, triisopropylamine, triisopropylamine, n-butylamine, monoethanolamine, diethanolamine, triethanolamine, monoisopropanolamine, diisopropanolamine, ethyleneimine, ethylenediamine and pyridine. In the invention, these alkaline agents may be employed alone or in combination.

Most preferred alkaline agents are silicates such as sodium silicate and potassium silicate. This is because the developing ability of the developer can be controlled, to some extent, by adjusting the ratio of the silicon oxide $SiO_2$ to the alkali metal oxide $M_2O$ which are components of the silicate (in general expressed in terms of the molar ratio: $[SiO_2]/[M_2O]$) and the concentration of the silicate. Examples of such developers are aqueous solutions of sodium silicate having a molar ratio: $[SiO_2]/[Na_2O]$ ranging from 1.0 to 1.5 and an $SiO_2$ content of 1 to 4% by weight as disclosed in J.P. KOKAI No. Sho 54-62004; and aqueous alkali metal silicate solutions having a ratio: $[SiO_2]/[M]$ of 0.5 to 0.75 (i.e., $[SiO_2]/[M_2O]$ of 1.0 to 1.5) and an $SiO_2$ content of 1 to 4% by weight and containing at least 20% Of potassium on the basis of the total gram atoms of the alkali metals present in the developer as disclosed in J.P. KOKOK0 No. Sho 57-7427.

When the photosensitive copying materials are developed with an automatic developing machine, it has been known that many photosensitive copying materials can be processed over a long time without exchanging the developer in the developing tank if an aqueous solution (replenisher) having an alkalinity higher than that of the developer is added to the developer. It is also preferred to adopt this replenishment in the present invention. For instance, there can preferably be used a method which comprises using an aqueous solution of sodium silicate having a molar ratio: $[SiO_2]/[Na_2O]$ ranging from 1.0 to 1.5 and an $SiO_2$ content of 1 to 4% by weight as disclosed in J.P. KOKAI No. Sho 54-62004 as a developer and continuously or intermittently adding an aqueous solution of sodium silicate (replenisher) having a molar ratio: $[SiO_2]/[Na_2O]$ ranging from 1.0 to 1.5 in proportion to the amount of the positive-working PS plates processed; and a method which uses an aqueous alkali metal silicate solution having a ratio: $[SiO_2]/[M]$ of 0.5 to 0.75 (i.e., $[SiO_2]/(M_2O)$ of 1.0 to 1.5) and an $SiO_2$ content of 1 to 4% by weight as a developer and an aqueous alkali metal silicate solution having a ratio: $[SiO_2]/[M]$ of 0.5 to 0.75 (i.e., $[SiO_2]/[M_2O]$ of 1.0 to 1.5) as a replenisher, both developer and replenisher containing at least 20% of potassium on the basis of the total gram atoms of the alkali metals present in the developer, as disclosed in J.P. KOKOKU No. Sho 57-7427. In order to reduce the running cost and the amount Of waste liquor, there can be used, for instance, a combination of a developer having a high activity and comprising an aqueous solution of an alkali metal silicate which has a molar ratio: $SiO_2/M_2O$ of 0.7 to 1.5 and an $SiO_2$ content of 1.0 to 4.0% by weight and a replenisher comprising an aqueous solution of an alkali metal silicate which has a molar ratio: $SiO_2/M_2O$ of 0.3 to 1.0 and an $SiO_2$ content of 0.5 to 4.0% by weight.

The developer and replenisher used in the invention may optionally comprise various kinds of surfactants and/or organic solvents. Surfactants usable herein are anionic, cationic, nonionic and amphoteric ones.

Examples of surfactants preferably used are nonionic surfactants such as polyoxyethylene alkyl ethers, polyoxyethylene alkylphenyl ethers, polyoxyethylene polystyrylpheyl ethers, polyoxyethylene polyoxypropylene alkyl ethers, glycerin fatty acid partial esters, sorbitan fatty acid partial esters, pentaerythritol fatty acid partial esters, propylene glycol fatty acid monoesters, sucrose fatty acid partial esters, polyoxyethylene sorbitan fatty acid partial esters, polyoxyethylene sorbitol fatty acid partial esters, polyethylene glycol fatty acid esters, polyglycerin fatty acid partial esters, polyoxyethylene-modified castor oils, polyoxyethylene glycerin fatty acid partial esters, fatty acid diethanolamides, N,N-bis-2-hydroxyalkylamines, polyoxyethylene alkylamines, triethanolamine fatty acid esters and trialkylamine oxides; anionic surfactants such as fatty acid salts, abietic acid salts, hydroxyalkanesulfonic acid salts, alkanesulfonic acid salts, salts of dialkylsulfosuccinic acid esters, linear alkylbenzenesulfonic acid salts, branched alkylbenzenesulfonic acid salts, alkylnaphthalenesulfonic acid salts, alkylphenoxy polyoxyethylene propylsulfonic acid salts, polyoxyethylene alkylsulfophenyl ether salts, sodium salt of N-methyl-N-oleyltaurine, disodium salts of N-alkylsulfosuccinic acid monoamides, petroleum sulfonic acid salts, sulfated tallow oil, sulfuric acid ester salts of fatty acid alkyl esters, alkylsulfuric acid ester salts, polyoxyethylene alkyl ether sulfuric acid ester salts, fatty acid monoglyceride sulfuric acid ester salts, polyoxyethylene alkylphenyl ether sulfuric acid ester salts, polyoxyethylene styrylphenyl ether sulfuric acid ester salts, alkyl phosphoric acid ester salts, polyoxyethylene alkyl ether phosphoric acid ester salts, polyoxyethylene alkylphenyl ether phosphoric acid ester salts, partially saponified products of styrene/maleic anhydride copolymers, partially saponified products of olefin/maleic anhydride copolymers and naphthalenesulfonic acid salts/formalin condensates; cationic surfactants such as alkylamine salts, quaternary ammonium salts, polyoxyethylene alkylamine salts and polyethylene polyamine derivatives; amphoteric surfactants such as carboxy betaines, aminocarboxylic acids, sulfobetaines, aminosulfuric acid esters and imidazolines. The "polyoxyethylene" moiety of the foregoing surfactants can be replaced with polyoxyalkylene moieties such as polyoxymethylene, polyoxypropylene and polyoxybutylene and these surfactants can also be used in the present invention.

Examples of other surfactants preferably used are fluorine atom-containing ones having, in the molecules, perfluoroalkyl groups. Specific examples thereof include anionic type ones such as perfluoroalkylcarboxylic acid salts, perfluoroalkylsulfonic acid salts and perfluoroalkylphosphoric acid esters; amphoteric type ones such as perfluoroalkyl betaines; cationic type ones such as perfluoroalkyl trimethylammonium salts; and nonionic type ones such as perfluoroalkylamine oxides, perfluoroalkyl ethylene oxide adducts, oligomers carrying perfluoroalkyl groups and hydrophilic groups, oligomers carrying perfluoroalkyl groups and lipophilic groups, oligomers carrying perfluoroalkyl groups, hydrophilic groups and lipophilic groups and urethanes carrying perfluoroalkyl groups and lipophilic groups.

The foregoing surfactants may be used alone or in combination and the amount thereof added to the developer preferably ranges from 0.001 to 10% by weight and more preferably 0.01 to 5% by weight.

The organic solvents which may be added to the developer are preferably selected from those having solubility in water of not more than about 10% by weight, in particular not more than 5% by weight. Examples of the organic solvent include 1-phenylethanol, 2-phenylethanol, 3-phenylpropanol-1, 4-phenylbutanol-1, 4-phenylbutanol-2, 2-phenylbutanol-1, 2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol, 3-methylcyclohexanol, N-phenyl ethanolamine and N-phenyl diethanolamine.

The amount of the organic solvents preferably ranges from 0.1 to 5% by weight with respect to the total weight of the developer practically employed. The amount of the organic solvent is closely related to that of the surfactant. More specifically, the amount of the surfactant should be increased with the increase in that of the organic solvent. This is because if the amount of the anionic surfactant is low and that of the organic solvent is great; the organic solvent is not completely solubilized in water and as a result, good developing properties of the composition cannot be ensured.

The developer and replenisher used in the invention may further comprise reducing agent for preventing the contamination of the resulting lithographic printing plate and this is particularly effective in the development Of negative-working PS plates comprising photosensitive diazonium salts. Examples of reducing agents preferably used are organic reducing agents, for instance, phenolic compounds such as thiosalicylic acid, hydroquinone, p-methyl amino phenol, methoxyquinone, resorcin and 2-methylresorcin; amine compounds such as phenylenediamine and phenyl hydrazine; and inorganic reducing agents such as sodium, potassium and ammonium salts of inorganic acids such as sulfinic acid, hydrosulfurous acid, phosphorous acid, hydrogenphosphorous acid, dihydrogenphosphorous acid, thiosulfuric acid, dithionous acid. Among these, those having particularly excellent effect of preventing contamination are sulfites. These reducing agents are preferably used in an amount ranging from 0.05 to 5% by weight on the basis of the weight of the developer practically employed.

The developer and replenisher may also comprise organic carboxylic acids. Preferred are aliphatic and aromatic carboxylic acids having 6 to 20 carbon atoms. Specific examples of the aliphatic carboxylic acids are caproic acid, enanthylic acid, caprilic acid, lauric acid, myristic acid, palmitic acid and stearic acid with the alkanoic acids having 8 to 12 carbon atoms being particularly preferred. These aliphatic acids may be unsaturated ones having, in the carbon chain, double bonds or those having branched carbon chains.

Examples of the aromatic carboxylic acids are compounds having carboxyl groups on the aromatic rings such as benzene, naphthalene and anthracene rings, for instance, o-chlorobenzoic acid, p-chlorobenzoic acid, o-hydroxybenzoic acid, p-hydroxybenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphthoic acid and 2-naphthoic acid, with the hydroxynaphthoic acids being particularly effective.

The foregoing aliphatic and aromatic carboxylic acids are preferably used in the form of sodium, potassium or ammonium salt for improving the solubility thereof in water. The amount of the organic carboxylic acids used in the developer is not restricted to a particular range. However, if they are used in an amount of less than 0.1% by weight, the desired effect thereof is not anticipated, while if they are used in an amount of more than 10% by weight, any further effect thereof is not anticipated and if other additives are simultaneously used, they interrupt the dissolution thereof. Therefore, the amount of the carboxylic acids preferably ranges from 0.1 to 10% by weight and more preferably 0.5 to 4% by weight on the basis of the total weight of the developer practically used.

The developer and replenisher used in the invention may optionally comprise additives such as antifoaming agents and/or water softeners. Examples of water softeners include polyphosphoric acids and sodium, potassium and ammonium salts thereof; polyaminocarboxylic acids and salts thereof such as ethylenediaminetetraacetic acid, diethylenetriaminepentaacetic acid, triethylenetetraminehexaacetic acid, hydr oxyethylethylenediaminetriacetic acid, nitrilotriacetic acid, 1,2-diaminocyclohexanetetraacetic acid and 1,3-diamino-2-propanoltetraacetic acid, and ammonium, potassium and sodium salts thereof; aminotri(methylenephosphonic acid), ethylenediaminetetra(methylenephosphonic acid), diethylenetriaminepenta(methylenephosphonic acid), triethylenetetraminehexa(methylenephosphonic acid), hydroxyethylethylenediaminetri(methylenephosphonic acid) and 1-hydroxyethane-1,1-diphosphonic acid, and ammonium, potassium and sodium salts thereof.

The optimum amount of the water softener varies depending on the chelating ability of a specific softener, the hardness and the amount of hard water used, but the amount thereof in general ranges from 0.01 to 5% by weight and preferably 0.01 to 0.5% by weight on the basis of the total weight of the developer practically used. If the amount of the softener is less than the lower limit, the desired effect cannot be anticipated, while if it exceeds the upper limit, images are adversely affected and cause color blinding or the like.

The balance of the developer and replenisher used in the invention is water, but they may optionally comprise other various additives commonly known in the art.

In the developer used in the invention, the amounts of the foregoing components are determined depending on various factors such as the kinds of the photosensitive copying materials (positive- or negative-working type) and permeability of an alkaline water through the second organic coating layer. In some cases, both positive- and negative-working photosensitive copying materials can be processed with the same developer.

It is preferred to prepare the developer and replenisher in the form of stock solutions having contents of the components higher than those practically used and diluted prior to use from the viewpoint of transportation. In this case, the contents are preferably selected such that each component does not cause separation and precipitation.

Developing

The method for processing a photosensitive copying material according to the present invention comprises the steps of imagewise exposing the material to light, immersing the imagewise exposed material in a developer and removing the second organic coating layer on non-image areas. The processing method may be applied to so-called tray development which comprises immersing an imagewise exposed photosensitive copying material in a developer in a tray, but the present invention can provide an optimum effect when it is applied to processing in an automatic developing machine.

In the processing with the automatic developing machine, the immersion of the imagewise exposed photosensitive copying material in the developer can generally be performed by horizontally conveying the material in the developing machine comprising a means for horizontally conveying the material, a bath for accomodating the developer and a means for spraying the developer and simultaneously pumping up the developer and spraying the material with the developer through a spray nozzle to form a liquid film to the developer on the material. Alternatively, the immersion or development of the material can preferably be performed by guiding and conveying it in the developer contained in a bath through the action of submerged guide rolls.

The development processing of the invention requires a time and temperature (temperature of the developer) sufficient for permeating the developer to the photosensitive layer through the second organic coating layer and dissolving the first organic coating layer on the non-image areas. The conditions for the development are determined depending on the ease of the development of the material and the strength of the developer used. As a result, the developing time preferably ranges from 3 to 90 seconds, more preferably 5 to 30 seconds and the developing temperature preferably ranges from 10° to 50° C., more preferably 20° to 40° C. If the time is shorter than the lower limit and the temperature is lower than the lower limit, the material is insufficiently developed, while if they exceed the upper limits, a part of the second organic coating layer is dissolved in the developer and thus the desired effect of the invention cannot be anticipated.

The material immersed in the developer is then treated with a pair of squeezee rolls to remove the developer adhered thereto and transferred to the subsequent water-washing zone. The water-washing zone comprises a spray nozzle for supplying water, a film-removing means for physically removing the second organic coating layer on the non-image areas such as a rotatable brush, a filter for recovering the dregs of the second layer removed and an overflow means for discharging excess water outside the system.

Fresh water is desirably supplied to the water-washing zone in an amount sufficient for diluting the developer carried over by the material in this zone to a level which does not cause the problem of environmental pollution at all and preferably ranges from 5 to 30 l/min. In this case, it is preferred to store the used washing-water and use it as preliminary washing-water from the viewpoint of water-washing efficiency and saving of water.

The removal of the second organic coating layer can be performed by rubbing the layer with a variety of brushes such as a rotatable and slidable cylindrical brush, a planar brush which can slides right and left or a planar brush which can move back and forth and side to side; or by blowing compressed air or high pressure water on the layer. The recovery of the dregs originating from the second organic coating layer is carried out by a filter which is fitted to a water-circulating system.

Various copying materials are thus obtained. In this respect, if the material is a lithographic printing plate, it can further be coated with a protective gumming solution to protect the material from defects and contamination.

According to the present invention, the ability of the developer to process photosensitive copying materials is substantially improved if a second organic coating layer hardly soluble in the developer is used as a principal ingredient of the photosensitive copying material and the removal of the second organic coating layer is not performed in the developer, but in the subsequent water-washing step or zone. Therefore, when a large number of copying materials are processed, it is sufficient to add a replenisher in an amount simply required for the compensation of the developer carried over by the processed copying material. This leads to the substantial reduction of waste liquor.

Moreover, the dregs originated from the second organic coating layer scraped out in the water-washing zone are recovered by a filter and this simplifies the post-treatments. Thus, a problem of environmental pollution does not arise at all and the washing water can be discharged without any post treatment or after a simple treatment.

The present invention will hereinafter be explained in more detail with reference to the following non-limitative working Examples and the effect practically accomplished by the invention will also be discussed in detail in comparison with Comparative Examples.

Example 1

A photosensitive solution for forming the first organic coating layer was prepared by dissolving 3 parts by weight of naphthoquinone-1,2-diazido-5-sulfonic acid ester of a polyhydroxy compound Obtained through polymerization/condensation of acetone and pyrogallol as disclosed in Example 1 of U.S. Pat. No. 3,635,709 and one part by weight of a novolak type cresol/formaldehyde resin in 20 parts by weight of 2-methoxyethyl acetate and 20 parts by weight of methyl ethyl ketone. An aluminum plate having a thickness of 0.3 mm, one side of which had been grained was anodized in a sulfuric acid solution to form an oxidized layer of about 3 g/m$^2$, sufficiently washed and then dried. The foregoing photosensitive solution was applied onto the grained surface of the aluminum plate thus treated in an amount of about 0.4 g/m$^2$ (weighed after drying) and then dried.

Then a 1:1 mixture of n-propyl alcohol and methyl alcohol was prepared and it was confirmed that the foregoing photosensitive layer was hardly soluble in the mixed solution. There were dissolved, in 100 parts by weight of the mixed alcohol solution, 8 parts by weight of a hexyl half ester of styrene/maleic anhydride copolymer and 0.005 part by weight of a dye (available from Orient Chemical Industry Co., Ltd. under the trade name of Oil Blue #603), the resulting solution was applied onto the o-quinonediazide photosensitive layer in an amount of 2.0 g/m$^2$ (weighed after drying) and then dried to form a second organic coating layer and to give a two-layer PS plate.

A positive original film was placed on the two-layer positive-working PS plate in close contact therewith and the assembly was imagewise exposed to light for 40 seconds in a printer (available from Eye Graphic Co., Ltd. under the trade name of Eye Rotary Printer P-311X) provided with a 3 KW metal halide lamp as a light source.

Separately, an automatic developing machine was provided, the machine comprising a device for automatically conveying PS plates, a dipping type developing zone provided with an air-barrier plate on the liquid surface and a subsequent water-washing and film-removing zone provided with a rotatable and slidable brush. The developing bath of the machine was filled with a developer which comprised an aqueous solution of potassium silicate having a molar ratio: $[SiO_2]/[M_2O]$ of 1.2 and an $SiO_2$ content of 1.5% by weight and included 0.04% by weight of an amphoteric surfactant, N-alkyl-N,N-dihydroxyethyl betaine and the developer was maintained at 30° C.

Then the imagewise exposed PS plate was conveyed at a speed such that the plate was immersed in the developer for 25 seconds. The developer penetrated into the exposed portion of the PS plate in the developing bath, but the second organic coating layer was not dissolved at all. The second layer was scraped out by the rotatable and slidable brush in the water-washing zone and the aluminum surface of the support was revealed.

A lithographic printing plate thus prepared was coated with a protective gumming solution (available from Fuji Photo Film Co., Ltd. under the trade name of GU-7) diluted two times and fitted to an offset printing press to carry out printing and as a result, good copies of more than 100,000 were obtained.

On the other hand, the same development procedures used above were repeated to process a large number of PS plates except that the amount of the developer carried over by the processed PS plates was compensated by the addition of a replenisher which was an aqueous solution of a silicate having a molar ratio: $[SiO_2]/[M_2O]$ of 1.2 and an $SiO_2$ content of 3.1% by weight.

As a result, the amount of the replenisher needed was only about 8 cc/m$^2$, the developer was only slightly deteriorated during the development processing and any formation of dregs and sludge in the developing bath was not observed at all even when a large amount of PS plates were processed over a long time.

The dregs originated from the second organic coating layer scraped out in the water-washing zone were not adhered to the PS plates during processing and were gradually recovered through a filter fitted to a washing water-circulating system.

Comparative Example 1

An automatic developing machine was provided, which was the same as that used in Example 1 except that a submerged rotatable brush was positioned downstream side of the dipping type developing zone, the brush was dismantled from the water-washing zone and a filter was fitted to a developer-circulating system. Then the same procedures used in Example 1 were repeated using the same PS plate, developer and replenisher used in Example 1.

Good lithographic printing plates as in Example 1 were initially obtained, but swollen dregs due to the second layer scraped out in the developer were adhered to the PS plate during processing as the amount of the PS plates processed was increased. In addition, the activity of the developer could not be compensated by the addition of only 8 cc/m$^2$ of the replenisher as the dregs of the organic coating layer were gradually dissolved in the developer and the PS plates were insufficiently developed. The activity of the developer was maintained by the addition of 33 cc/m$^2$ of the replenisher, but this was accompanied by the generation of about 25 cc/m$^2$ of overflow waste liquor.

Example 2

A photosensitive solution for forming the first organic coating layer was prepared by dissolving 3 parts by weight of naphthoquinone-1,2-diazido-5-sulfonic acid ester of a polyhydroxy compound obtained through polymerization/condensation of acetone and pyrogallol as disclosed in Example 1 of U.S. Pat. No. 3,635,709 in 20 parts by weight of 2-methoxyethyl acetate and 20 parts by weight of methyl ethyl ketone.

An aluminum plate having a thickness of 0.3 mm was surface-grained with a nylon brush and an aqueous suspension of 400 mesh pumice stone and then sufficiently washed with water. After etching the plate by immersing in a 10% sodium hydroxide solution at 70° C. for 60 seconds and washing with running water, the plate was electrolytically surface-roughened in a 1% aqueous solution of nitric acid at an anodic voltage, $V_A$, of 12.7 v such that the quantity of electricity at the anode time was 160 coulomb/dm$^2$ using a sinusoidal alternating wave current. At this stage, the surface roughness thereof was determined to be 0.6 μ (expressed in terms of the Ha unit). Then it was desmutted by immersing in a 30% aqueous solution of sulfuric acid at 55° C. for 2 minutes and anodized in a 20% aqueous solution of sulfuric acid at a current density of 2 A/dm$^2$ so that the thickness of the resulting anodized layer was 2.7 g/m$^2$.

The foregoing photosensitive solution was applied onto the surface of the aluminum plate thus treated in an amount of about 0.3 g/m$^2$ (weighed after drying) and then dried.

Then to a 1:1 mixture of n-propyl alcohol and methyl alcohol, there were dissolved 8 parts by weight of an alcohol-soluble nylon (available from Toray Industries, Inc. under the trade name of Toray Amiran 4000CM) and 0.05 part by weight of a dye (available from Orient Chemical Industry Co., Ltd. under the trade name of Oil Blue #603), the resulting solution was applied onto the o-quinonediazide photosensitive layer in an amount of 1.5 g/m$^2$ (weighed after drying) and then dried to form a second organic coating layer.

The PS plate thus obtained was processed in the same manner used in Example 1. The resulting images had high wear resistance peculiar to nylon. Printing operation was performed using the resulting lithographic printing plate and as a result, good copies of more than 200,000 were obtained.

Example 3

The same procedures used in Example 1 were repeated to give a two-layer photosensitive copying material except that a transparent polyethylene terephthalate film having a thickness of 0.1 mm was substituted for the aluminum plate used in Example 1. The resulting photosensitive material was imagewise exposed to light and developed in the same manner used in Example 1 to give a transparent sheet carrying blue images. The sheet could be used as an original for an overhead projector.

Example 4

An aluminum plate having a thickness of 0.2 mm was surface-grained with a nylon brush and an aqueous suspension of 400 mesh pumice stone and then sufficiently washed with water. After etching the plate by immersing in a 10% sodium hydroxide solution at 70° C. for 60seconds and washing with running water, the plate was electrolytically surface-roughened in a 1% aqueous solution of nitric acid at an anodic voltage, $V_A$, of 12.7 V such that the quantity of electricity at the anode time was 160 coulomb/dm$^2$ using a sinusoidal alternating wave current. Then it was desmutted by immersing in a 30% aqueous solution of sulfuric acid at 55° C. for 2 minutes and anodized in a 20% aqueous solution of sulfuric acid at a current density of 2 A/dm$^2$ so that the thickness of the resulting anodized layer was 2.7 g/m$^2$ and thereafter hydrophilized with a 2% aqueous solution of No. 3 sodium silicate at 70° C.

Then a solution obtained by dissolving 2 parts by weight of hexafluorophosphate of p-diazodiphenylamine/paraformaldehyde condensate in 40 parts by weight of 2-methoxyethanol was applied onto the aluminum plate having a hydrophilized surface in an amount of 0.2 g/m$^2$ (weighed after drying) and then dried to form a diazo photosensitive layer (first organic coating layer).

Then 8 parts by weight of a polyurethane resin (available from Monsanto Chemical Co. under the trade name of Estan #5715) and 0.05 part by weight of a dye (available from Orient Chemical Co., Ltd. under the trade name of Oil Blue #603) were dissolved in 60 parts by weight of 2-methoxyethyl acetate and 40 parts by weight of methyl ethyl ketone, the solution was then applied onto the diazo photosensitive layer in an amount of 2 g/m$^2$ (weighed after drying) and dried to form a second organic coating layer and to thus give a negative-working PS plate.

The resulting PS plate was cut into a large number of sheets each having a size of 1003 mm×800 mm and these sheets were imagewise exposed to light from a 3 KW metal halide lamp through a negative original film for 30 seconds at a distance of 1 m.

Then an automatic developing machine was provided, the machine comprising a device for horizontally automatically conveying PS plates, a spray type developing zone and a water-washing and film-removing zone provided with a rotatable brush. The developing bath of the machine was filled with a developer which comprised an aqueous solution containing 4.5% by weight of benzyl alcohol, 1.5% by weight of triethanolamine, 1.5% by weight of sodium isopropylnaphthalenesulfonate and 0.3% by weight of sodium sulfite and the developer was maintained at 30° C.

Then the imagewise exposed PS plate was conveyed at a speed such that the time required for the plate to pass through the developing zone was 25 seconds and the developer was supplied to the plate surface. The developer penetrated into the unexposed portion of the PS plate in the developing bath, but the second organic coating layer was not dissolved at all. The second layer was scraped out by the rotatable and slidable brush in the water-washing zone and the hydrophilic aluminum surface of the support was exposed.

A lithographic printing plate thus prepared was coated with a protective gumming solution (available from Fuji Photo Film Co., Ltd. under the trade name of GU-7) diluted two times and fitted to an offset printing press to carry out printing and as a result, good copies of more than 100,000 were obtained.

On the other hand, the same development procedures used above were repeated to process a large number of PS plates except that the amount of the developer carried over by the processed PS plates was compensated by the addition of a replenisher which had the same composition as that of the developer.

As a result, the amount of the replenisher needed was only about 8 cc/m$^2$, the developer was only slightly deteriorated during the development processing and any formation of dregs and sludge in the developing bath was not observed at all even when a large amount of PS plates were processed over a long time.

The dregs originated from the second organic coating layer scraped out in the water-washing zone were not adhered to the PS plates during processing and were gradually recovered through a filter fitted to a washing water-circulating system.

Example 5

A photosensitive solution for forming the first organic coating layer was prepared by dissolving 2 parts by weight of naphthoquinone-1,2-diazido-5-sulfonic acid ester of a polyhydroxy compound obtained through polymerization/condensation of acetone and pyrogallol as disclosed in Example 1 of U.S. Pat. No. 3,635,709 and 2 parts by weight of a novolak type cresol/formaldehyde resin in 20 parts by weight of 2-methyoxyethyl acetate and 20 parts by weight of methyl ethyl ketone.

An aluminum plate having a thickness of 0.3 mm, one side of which had been grained was anodized in a sulfuric acid solution to form an oxidized layer of about 3 $g/m^2$, sufficiently washed and then dried. The foregoing photosensitive solution was applied onto the grained surface of the aluminum plate thus treated in an amount of about 0.4 $g/m^2$ (weighed after drying) and then dried.

Then 20 parts by weight of a latex of a polyacrylate copolymer (JULIMER SEK101, solid content 40%; available from Nippon Pure Chemical Co., Ltd.) was diluted with 90 parts by weight of water and 0.05 part by weight of a dye (Victoria Pure Blue BOH, available from Hodogaya Chemical Co., Ltd.) was dissolved therein. The resulting solution was applied onto the foregoing o-quinonediazide photosensitive layer in an amount of 2.0 $g/m^2$ (weighed after drying) and then dried to form a second organic coating layer and to thus give a two-layer P plate.

The PS plate thus obtained was processed in the same manner as in Example 1, then the resulting lithographic plate was fitted to an offset printing press to carry out printing and as a result, good copies Of more than 100,000 were Obtained.

On the other hand, the same development procedures used above were repeated to process a large number of PS plates except that the amount of the developer carried over by the processed PS plates was compensated by the addition of a replenisher which was an aqueous solution of a silicate having a molar ratio: $[SiO_2] \cdot [M_2O]$ of 1.2 and an $SiO_2$ content of 3.1% by weight.

As a result, the amount of the replenisher needed was only about 30 $cc/m^2$. Thus, it was found out that when the photosensitive material and the processing method were adopted, the developer was Only slightly deteriorated during the development processing.

In this case, the amount of the developer carried over by the copying material was about 10 $cc/m^2$ and the amount of the overflow waste liquor was about 20 $cc/m^2$.

Example 6

An automatic developing machine was provided, the machine comprising a device for automatically conveying PS plates, a dipping type developing zone provided with an air-barrier plate on the liquid surface and a subsequent water-washing and film-removing zone provided with a rotatable and slidable brush. The developing bath of the machine was filled with the same developer used in Example 1 and the developer was maintained at 30° C.

Then the imagewise exposed PS plate Obtained in Example 5 was conveyed at a speed such that the plate was immersed in the developer for 25 seconds. The developer penetrated into the exposed portion of the PS plate in the developing bath, but the second organic coating layer was not dissolved at all. The second layer was scraped out by the rotatable and slidable brush in the subsequent water-washing zone and the aluminum surface of the support was revealed.

A lithographic printing plate thus prepared was coated with a protective gumming solution (available from Fuji Photo Film Co., Ltd. under the trade name of GU-7) diluted two times and fitted to an offset printing press to carry out printing and as a result, good copies of more than 100,000 were obtained.

On the other hand, the same development procedures used above were repeated to process a large number of PS plates except that the amount of the developer carried over by the processed PS plates was compensated by the addition of the replenisher used in Example 1.

As a result, the amount of the replenisher needed was only about 10 $cc/m^2$, the developer was only slightly deteriorated during the development processing and any formation of dregs and sludge in the developing bath was not observed at all even when a large amount of PS plates was processed over a long time.

The dregs originated from the second organic coating layer scraped out in the water-washing zone were not adhered to the PS plates during processing and were gradually recovered through a filter fitted to a washing water-circulating system.

Example 7

A photosensitive solution for forming the first organic coating layer was prepared by dissolving 2 parts by weight of naphthoquinone-1,2-diazido-5-sulfonic acid ester of a polyhydroxy compound obtained through polymerization/condensation of acetone and pyrogallol as disclosed in Example 5 of U.S. Pat. No. 3,635,709 and 3 parts by weight of phenol novolak resin in 20 parts by weight of 2-methyoxyethyl acetate and 20 parts by weight of methyl ethyl ketone.

An aluminum plate having a thickness of 0.3 mm was surface-grained with a nylon brush and an aqueous suspension of 400 mesh pumice stone and then sufficiently washed with water. After etching the plate by immersing in a 10% sodium hydroxide solution at 70° C. for 60 seconds and washing with running water, the plate was electrolytically surface-roughened in a 1% aqueous solution of nitric acid at an anodic voltage, $V_A$, of 12.7 V such that the quantity of electricity at the anode time was 160 coulomb/$dm^2$ using a sinusoidal alternating wave current. At this stage, the surface roughness thereof was determined to be 0.6 μ (expressed in terms of the Ha unit). Then it was desmutted by immersing in a 30% aqueous solution of sulfuric acid at 55° C. for 2 minutes and anodized in a 20% aqueous solution of sulfuric acid at a current density of 2 A/$dm^2$ so that the thickness of the resulting anodized layer was 2.7 $g/m^2$.

The foregoing photosensitive solution was applied onto the surface of the aluminum plate thus treated in an amount of about 0.3 $g/m^2$ (weighed after drying) and then dried.

Then 20 parts by weight of a colloidal dispersion type urethane resin (HYDRAN HW-312B, solid content 40%; available from Dainippon Ink and Chemicals, Inc.) was diluted with and dispersed in 80 parts by weight of water, 0.05 part by weight of a dye (available from Hodogaya Chemical Co., Ltd. under the trade name of Victoria Pure Blue BOH) was dissolved therein and the resulting solution was applied onto the o-quinonediazide photosensitive layer in an amount of 1.5 $g/m^2$ (weighed after drying) and then dried to form a second organic coating layer.

The PS plate thus obtained was processed in the same manner used in Example 1. The resulting images had high wear resistance peculiar to urethane. Printing operation was performed using the resulting lithographic printing plate and as a result, good copies of more than 200,000 were obtained.

Example 8

The same procedures used in Example 5 to give a two-layer photosensitive copying material except that a transparent polyethylene terephthalate film having a thickness of 0.1 mm was substituted for the aluminum plate used in Example 5. The resulting photosensitive material was imagewise exposed to light and developed in the same manner used in Example 5 to give a transparent sheet carrying blue images. The sheet could be used as an original for an overhead projector.

Example 9

To a 500 ml beaker, there was added 300 g of 1,2-dichloroethane and then 60 g of polyvinyl formal (#100, degree of polymerization about 800, vinyl acetate residue 10.5±1.5, polyvinyl residue 5.5—0.5; available from Electro-Chemical Industries, Ltd.) was dissolved with stirring. Separately, a 2 l three-necked flask equipped with a stirring machine and a dropping funnel was provided, 700 ml of pure water was added thereto, and then 10 g of polyvinyl alcohol (GL-05 available from The Nippon Synthetic Chemical Industry Co., Ltd.; degree of saponification 86.5 to 89 mole %, average degree of polymerization 500) and 2 g of sodium lauryl alcohol sulfuric acid ester (purity in terms of activity 75 to 80%) were dissolved in the pure water with stirring. Then the number of revolutions was increased to 1000 RPM and the foregoing polyvinyl formal solution was dropwise added to this solution through the dropping funnel at a velocity of about 50 ml/min. After completion of the dropwise addition, the stirring was continued at room temperature for about 10 minutes and then the flask was heated to about 80° C. and it was maintained at this temperature for about 2 hours while stirring to remove 1,2-dichloroethane.

The resulting emulsion was diluted with 2000 ml of pure water, applied onto an o-quinonediazide photosensitive layer formed on an aluminum support prepared and treated in the same manner used in Example 1 in an amount of 1.5 g/m² (weighed after drying) and then dried to give a PS plate. The PS plate was imagewise exposed to light and developed in the same manner used in Example 6. As a result, the second organic coating layer on the exposed portion was removed to give a lithographic printing plate having the exposed aluminum support surface which showed good ink receptivity during printing and thus good copies of about 100,000 could be obtained.

Comparative Example 2

A second organic coating layer was formed by applying a solution of polyvinyl formal in 1,2-dichloroethane without preparing emulsion thereof to an o-quinonediazide photosensitive layer, but the photosensitive layer was dissolved and accordingly any PS plate having a practically acceptable layer structure could not be obtained.

Example 10

A 1% by weight solution was prepared by dissolving, in methyl cellosolve, a p-diazodiphenylamine/paraformaldehyde condensate prepared by the method disclosed in J.P. KOKOKU No. Sho 42-5364 and a photosensitive diazo reaction product of 2-oxy-4-methoxybenzophenone-5-sulfonic acid.

On the other hand, a 3S aluminum plate was degreased by immersing it in a 10% by weight aqueous solution of sodium tertiary phosphate maintained at 80° C. for 3 minutes and then washed with water. It was then desmutted with a 70% by weight nitric acid solution, washed with water and immersed in a 2% by weight JIS No. 3 sodium silicate solution maintained at 70° C. for one minute. After washing with water and drying, the foregoing solution was applied thereto.

Then 20 parts by weight of a polyacrylate copolymer latex (JULIMER SEK101, solid content 40%; available from Nippon Pure Chemical Co., Ltd.) were diluted with 90 parts by weight of water and 0.05 part by weight of a dye (Victoria Pure Blue BOH, available from Hodogaya Chemical Co., Ltd.) was dissolved therein. The resulting solution was applied onto the o-quinonediazide photosensitive layer in an amount of 2.0 g/m² (weighed after drying) and dried to give a two-layer type PS plate.

A negative original transparency was placed on the two-layer negative-working PS plate in close contact therewith and the assembly was imagewise exposed to light for 40 seconds in a printer (available from Eye Graphic Co., Ltd. under the trade name of Eye Rotary Printer P-311X) provided with a 3 KW metal halide lamp as a light source.

Separately, an automatic developing machine was provided, the machine comprising a device for automatically conveying PS plates, a dipping type developing zone provided with an air-barrier plate on the liquid surface and a subsequent water-washing and film-removing zone provided with a rotatable and slidable brush. The developing bath of the machine was filled with a developer which comprised an aqueous solution containing 4.5% by weight of benzyl alcohol, 1.5% by weight of triethanolamine, 1.5% by weight of sodium isopropylnaphthalenesulfonate and 0.3% by weight of sodium sulfite and the developer was maintained at 30° C.

Then the imagewise exposed PS plate was conveyed at a speed such that the time required for the plate to pass through the developing zone was 25 seconds while dipping the PS plate in the developer. The developer penetrated into the unexposed portion of the PS plate in the developing bath, but the second organic coating layer was not dissolved at all. The second layer on the non-exposed portion was scraped out by the rotatable and slidable brush in the subsequent water-washing zone and the aluminum surface of the support was revealed.

A lithographic printing plate thus prepared was coated with a protective gumming solution (available from Fuji Photo Film Co., Ltd. under the trade name of GU-7) diluted two times and fitted to an offset printing press to carry out printing and as a result, good copies of more than 100,000 were obtained.

On the other hand, the same development procedures used above were repeated to process a large number of PS plates except that the amount of the developer carried over by the processed PS plates was compensated by the addition of a replenisher which had the same composition as that of the developer. As a result, the amount of the replenisher needed was only about 8 cc/m², the developer was only slightly deteriorated during the development processing and any formation of dregs and sludge in the developing bath was not observed at all even when a large amount of PS plates was processed over a long time.

The dregs originated from the second organic coating layer scraped out in the water-washing zone were not adhered to the PS plates during processing and were gradually recovered through a filter fitted to a washing water-circulating system.

Comparative Example 3

An automatic developing machine was provided, which was the same as that used in Example 10 except that a submerged rotatable brush was positioned downstream side of the dipping type developing zone, the brush was dismantled from the water-washing zone and a filter was fitted to a developer-circulating system. Then the same procedures used in Example 10 were repeated using the same PS plate, developer and replenisher used in Example 10.

Good lithographic printing plates as in Example 10 were initially obtained, but swollen dregs due to the second layer scraped out in the developer were adhered to the PS plate during processing as the amount of the PS plates processed was increased. In addition, the activity of the developer could not be compensated by the addition of only 8 cc/m$^2$ of the replenisher as the dregs of the organic coating layer were gradually dissolved in the developer and the PS plates were insufficiently developed. The activity of the developer was maintained by the addition of 33 cc/m$^2$ of the replenisher, but this was accompanied by the generation of about 25 cc/m$^2$ of overflow waste liquor.

Cl Example 11

An aluminum plate having a thickness of 0.2 mm was surface-grained with a nylon brush and an aqueous suspension of 400 mesh pumice stone and then sufficiently washed with water. After etching the plate by immersing in a 10% sodium hydroxide solution at 70° C. for 60 seconds and washing with running water, the plate was electrolytically surface-roughened in a 1% aqueous solution of nitric acid at an anodic voltage, $V_A$, of 12.7 V such that the quantity of electricity at the anode time was 160 coulomb/dm$^2$ using a sinusoidal alternating wave current. Then it was desmutted by immersing in a 30% aqueous solution of sulfuric acid at 55° C. for 2 minutes and anodized in a 20% aqueous solution of sulfuric acid at a current density of 2 A/dm$^2$ so that the thickness of the resulting anodized layer was 2.7 g/m$^2$. Thereafter, it was hydrophilized with a 2% No. 3 sodium silicate aqueous solution at 70° C.

Then a solution obtained by dissolving 2 parts by weight of hexafluorophosphate of p-diazodiphenylamine/paraformaldehyde condensate in 40 parts by weight of 2-methoxyethanol was applied onto the aluminum plate having a hydrophilized surface in an amount of 0.2 g/m$^2$ (weighed after drying) and then dried to form a diazo photosensitive layer (first organic coating layer).

Then 20 parts by weight of a colloidal dispersion type urethane resin (HYDRAN HW-312B, solid content 40%; available from Dainippon Ink and Chemicals, Inc.) was diluted with and dispersed in 80 parts by weight of water, 0.05 part by weight of a dye (available from Hodogaya Chemical Co., Ltd. under the trade name of victoria Pure Blue BOH) was dissolved therein and the resulting solution was applied onto the o-quinonediazide photosensitive layer in an amount of 1.5 g/m$^2$ (weighed after drying) and then dried to form a second organic coating layer.

The PS plate thus obtained was processed in the same manner used in Example 10. The resulting images had high wear resistance peculiar to urethane. Printing operation was performed using the resulting lithographic printing plate and as a result, good copies of more than 200,000 were obtained.

Example 12

The same procedures used in Example 10 were repeated to give a two-layer photosensitive copying material except that a transparent polyethylene terephthalate film having a thickness of 0.1 mm was substituted for the aluminum plate used in Example 10. The resulting photosensitive material was imagewise exposed to light and developed in the same manner used in Example 10 to give a transparent sheet carrying blue images. The sheet could be used as an original for an overhead projector.

Example 13

An automatic developing machine was provided, the machine comprising a device for horizontally and automatically conveying PS plates, a spray type developing zone and a subsequent water-washing and film-removing zone provided with a rotatable and slidable brush. The developing bath of the machine was filled with the same developer used in Example 10 and the developer was maintained at 30° C.

Then the imagewise exposed PS plate obtained in Example 10 was conveyed at a speed such that the plate was immersed in the developer for 25 seconds. The developer penetrated into the non-exposed portion of the PS plate in the developing bath, but the second organic coating layer was not dissolved at all. The second layer was scraped Out by the rotatable and slidable brush in the subsequent water-washing zone and the aluminum surface on the non-exposed portion was exposed.

A lithographic printing plate thus prepared was coated with a protective gumming solution (available from Fuji Photo Film Co., Ltd. under the trade name of GU-7) diluted two times and fitted to an offset printing press to carry out printing and as a result, good copies of more than 100,000 were obtained.

On the other hand, the same development procedures used above were repeated to process a large number of PS plates except that the amount of the developer carried over by the processed PS plates was compensated by the addition of the replenisher used in Example 10.

As a result, the amount of the replenisher needed was only about 10 ml/m$^2$, the developer was only slightly deteriorated during the development processing and any formation of dregs and sludge in the developing bath was not observed at all even when a large amount of PS plates was processed over a long time.

The dregs originated from the second organic coating layer scraped out in the water-washing zone were not adhered to the PS plates during processing and were gradually recovered through a filter fitted to a washing water-circulating system.

Example 14

To a 500 ml beaker, there was added 300 g of 1,2-dichloroethane and then 60 g of polyvinyl formal (#100, degree of polymerization about 800, vinyl acetate residue 10.5±1.5, polyvinyl residue 5.5±0.5; available from Electro-Chemical Industries, Ltd.) was dissolved with stirring. Separately, a 2 l three-necked flask equipped with a stirring machine and a dropping funnel was provided, 700 ml of pure water was added thereto, and then 10 g of polyvinyl alcohol (GL-05 available from The Nippon Synthetic Chemical Industry Co., Ltd.; degree of saponification 86.5 to 89 mole %, average degree of polymerization 500) and 2 g of sodium lauryl alcohol sulfuric acid ester (purity in terms of activity 75 to 80%) were dissolved in the pure water with stirring. Then the number of revolutions was increased to 1000 RPM and the foregoing polyvinyl formal solution was dropwise added to this solution through the dropping funnel at a velocity of about 50 ml/min. After completion of the dropwise addition, the stirring was continued at room temperature for about 10 minutes and then the flask was heated to about 80° C. and it was maintained at this temperature for about 2 hours while stirring to remove 1,2-dichloroethane.

The resulting emulsion was diluted with 2000 ml of pure water, applied onto an o-quinonediazide photosensitive layer formed on an aluminum support prepared and treated in the same manner used in Example 11 in an amount of 1.5 g/m² (weighed after drying) and then dried to give a PS plate. The PS plate was imagewise exposed to light and developed in the same manner used in Example 11. As a result, the second organic coating layer on the non-exposed portion was removed to give a lithographic printing plate having partially exposed aluminum support surface which showed good ink receptivity during printing and thus good copies of about 100,000 could be obtained.

We claim:

1. A method for processing a photosensitive copying material comprising the steps of imagewise exposing to light a photosensitive copying material which comprises a support having in order (i) a first photosensitive organic coating layer whose solubility in a developing solution varies through irradiation with light rays and (ii) a second organic coating layer containing a water-insoluble and organic solvent-soluble polymeric compound having a film-forming ability and then developing the imagewise exposed copying material, wherein the imagewise exposed material is dipped in the developing solution and then water-washed to remove the first and second organic coating layers on non-image portions.

2. The method of claim 1 wherein the second organic coating layer of the photosensitive copying material is formed by applying an emulsion of a water-insoluble and organic solvent-soluble polymeric compound having a film-forming ability.

3. The method of claim 2 wherein the emulsion is a latex of a lipophilic polymer.

4. The method of claim 3 wherein the polymer is a member selected from the group consisting of homopolymers and copolymers of monomers selected from the following group A; copolymers of at least one monomer of the group A and at least one monomer selected from the following group B; and polymers of at least one monomer selected from the following group C:

group A: monomers represented by the following general formula:

$$CHX=CYZ$$

wherein X represents a hydrogen atom, a methyl group or a group: —COOR$^1$; Y represents a hydrogen or halogen atom or methyl, —C(CH$_2$)$_n$ COOR$^2$ or nitrile group; Z represents an aryl, heterocyclic, —COOR$^3$, —OR$^3$, —O—COR$^3$, —CONR$^3$ or nitrile group; R$^1$, R$^2$ and R$^3$ may be the same or different and each represents an aliphatic or aromatic group; and n is an integer of 0 to 3;

group B: ethylenic monomers having at least one free carboxylic acid residue, sulfonic acid residue, phosphoric acid residue or a salt thereof; and hydroxyalkyl esters and amides of the carboxylic acids;

group C: divinylic monomers.

5. The method of claim 3 wherein the polymer comprises, in the main chain or on the side chains, at least one group selected from the group consisting of hydroxyl, amino, amido, imino, imido, nitrilo, carboxyl, sulfonyl, sulfonyloxy, isocyanate, urethane, azoimido, azo, hydrazino, carbamido, carbamyl, epoxy, mercapto, thio and sulfonamido groups.

6. The method of claim 2 wherein the second organic coating layer comprises an o-quinonediazide compound in an amount of not more than 20%.

7. The method of claim 1 wherein the first organic coating layer of the photosensitive copying material is a negative-working photosensitive layer whose solubility in the developing solution is lowered through the irradiation with light rays.

8. The method of claim 7 wherein the negative-working photosensitive layer is formed from a negative-working photosensitive composition comprising a photosensitive diazo compound or a photopolymerizable or photocrosslinkable photosensitive composition.

9. The method of claim 8 wherein the negative-working photosensitive composition comprises, as a binder, an alkali-soluble or swellable lipophilic polymer comprising unsaturated carboxylic acid moieties as a binder in an amount of 0 to 50% by weight on the basis of the total solid content of the composition and the acid value of the polymer ranges from 0.2 to 5.0 meq/g.

10. The method of claim 8 wherein the negative-working photosensitive composition comprises at least one additive selected from the group consisting of plasticizers, acids, printing out agents, dyes or pigments, cyclic acid anhydrides, phenols and higher alcohols.

11. The method of claim 1 wherein the first organic coating layer of the photosensitive copying material is a positive-working photosensitive layer whose solubility in the developing solution is increased by the irradiation with light rays.

12. The method of claim 11 wherein the first organic coating layer of the photosensitive copying material comprises o-naphthoquinonediazide compound as a principal component.

13. The method of claim 11 wherein the first organic coating layer comprises an alkali-soluble polymer comprising unsaturated carboxylic acid moieties as a binder and the acid value of the polymer ranges from 0.5 to 5 meq/g.

14. The method of claim 13 wherein the first organic coating layer comprises the binder in an amount of not more than 80% by weight on the basis of the total weight of a positive-working photosensitive composition used for forming the first layer.

15. The method of claim 11 wherein the first organic coating layer comprises a cyclic acid anhydride, a phenol compound and/or an organic acid in an amount ranging from 0.1 to 5% by weight on the basis of the total weight of a positive-working photosensitive composition for forming the first layer.

16. The method of claim 11 wherein the first organic coating layer comprises nonionic and/or amphoteric surfactants in an amount of 0.1 to 5% by weight on the basis of the total weight of a positive-working photosensitive composition for forming the first layer.

17. The method of claim 11 wherein the first organic coating layer comprises a fluorine atom-containing surfactant in an amount of 0.005 to 0.5% by weight on the basis of the total weight of a positive-working photosensitive composition for forming the first layer.

18. The method of claim 1 wherein the development is carried out while intermittently or continuously compensating the developing solution carried over by the processed photosensitive copying material with a replenisher.

19. The method of claim 1 wherein the development is carried out at a temperature ranging from 10° to 50° C. for 3 to 90 seconds.

20. The method of claim 1 wherein the developed photosensitive copying material is washed by supplying fresh water at a rate of 5 to 30 l/min and dregs originating from the second organic coating layer are recovered by a filter fitted to a washing water-circulating system.

* * * * *